(12) United States Patent
Lee et al.

(10) Patent No.: US 10,770,684 B2
(45) Date of Patent: Sep. 8, 2020

(54) DISPLAY DEVICE INCLUDING A STRESS NEUTRALIZING LAYER

(71) Applicant: SAMSUNG DISPLAY CO., LTD., Yongin-si, Gyeonggi-Do (KR)

(72) Inventors: Kwangho Lee, Seoul (KR); Jaeyoung Sim, Anyang-si (KR); Kyungho Jung, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/244,325

(22) Filed: Jan. 10, 2019

(65) Prior Publication Data
US 2019/0319215 A1    Oct. 17, 2019

(30) Foreign Application Priority Data
Apr. 13, 2018 (KR) ........................ 10-2018-0043366

(51) Int. Cl.
| H01L 51/52 | (2006.01) |
| H01L 51/00 | (2006.01) |
| H01L 51/56 | (2006.01) |
| H01L 27/32 | (2006.01) |
| G09F 9/30  | (2006.01) |

(52) U.S. Cl.
CPC .......... *H01L 51/5253* (2013.01); *G09F 9/301* (2013.01); *H01L 27/3276* (2013.01); *H01L 51/0097* (2013.01); *H01L 51/5246* (2013.01); *H01L 51/56* (2013.01); *H01L 27/3246* (2013.01)

(58) Field of Classification Search
CPC ............. H01L 51/5253; H01L 51/0097; H01L 51/5246; H01L 51/56; H01L 27/3276; H01L 27/3246; G09F 9/301
USPC .......................................................... 257/40
See application file for complete search history.

(56) References Cited

U.S. PATENT DOCUMENTS

| 7,403,250 | B2 | 7/2008 | Yun et al. | |
| 8,610,349 | B2 | 12/2013 | Kim | |
| 2016/0174304 | A1* | 6/2016 | Kim | ...................... H05B 33/04 |
| | | | | 313/511 |
| 2017/0020007 | A1* | 1/2017 | Park | ...................... H05K 1/028 |
| 2017/0237025 | A1 | 8/2017 | Choi et al. | |
| 2017/0263887 | A1 | 9/2017 | Han et al. | |
| 2017/0321087 | A1* | 11/2017 | Moon | ..................... G06F 3/044 |

FOREIGN PATENT DOCUMENTS

| KR | 100928924 | 11/2009 |
| KR | 1020170096089 | 8/2017 |
| KR | 101844432 | 3/2018 |

* cited by examiner

*Primary Examiner* — Tong-Ho Kim
(74) *Attorney, Agent, or Firm* — F. Chau & Associates, LLC

(57) ABSTRACT

A display device includes a substrate having a first area, a second area, and a bending area between the first area and the second area. A display element is disposed in the first area of the substrate. A stress neutralizing layer is disposed in the first area, the second area and the bending area. A thickness of the stress neutralizing layer in the bending area is less than a thickness of the stress neutralizing layer in at least one of the first area or the second area.

18 Claims, 22 Drawing Sheets

DISPLAY DEVICE INCLUDING A STRESS NEUTRALIZING LAYER

CROSS-REFERENCE TO RELATED APPLICATION

This application claims priority under 35 U.S.C. § 119 to Korean Patent Application No. 10-2018-0043366, filed on Apr. 13, 2018, in the Korean Intellectual Property Office (KIPO), the disclosure of which is incorporated by reference herein in its entirety.

1. TECHNICAL FIELD

Exemplary embodiments of the present invention relate to a display device, and more particularly, to a display device including a stress neutralizing layer.

2. DISCUSSION OF RELATED ART

In general, substrates of display devices may have a bent shape to increase the visibility and slimness of the display device.

However, the bending area may be subjected to a relatively large tensile stress as compared to other areas. Accordingly, damage may occur to an insulating layer or a signal line in the bending area.

SUMMARY

Exemplary embodiments of the present invention provide a display device capable of substantially preventing damage to an insulating layer or a signal line in a bending area by reducing stress of the bending area.

According to an exemplary embodiment of the present invention, a display device includes a substrate having a first area, a second area, and a bending area between the first area and the second area. A display element is disposed in the first area of the substrate. A stress neutralizing layer is disposed in the first area, the second area and the bending area. A thickness of the stress neutralizing layer in the bending area is less than a thickness of the stress neutralizing layer in at least one of the first area or the second area.

The thickness of the stress neutralizing layer in substantially the entire bending area may be less than the thickness of stress neutralizing layer in at least one of the first area or the second area.

The thickness of the stress neutralizing layer in the bending area may be substantially constant across the entire bending area.

The stress neutralizing layer may have a thickness in a range of from about 0.1 μm to about 50 μm.

The stress neutralizing layer may have a modulus in a range of from about 350 MPa to about 500 MPa.

The display device may include a polarizing member disposed on the display element in the first area of the substrate.

The thickness of the stress neutralizing layer in substantially the entire bending area may be less than a thickness of the polarizing member.

The thickness of the stress neutralizing layer in the first area and the second area may be greater than a thickness of the polarizing member.

The polarizing member may include a first adhesive layer on the display element. A second adhesive layer may be on the first adhesive layer. A polarizing plate may be between the first adhesive layer and the second adhesive layer.

The thickness of the stress neutralizing layer in the entire bending area may be less than about ½ of the thickness of the stress neutralizing layer in at least one of the first area or the second area.

A first surface of the stress neutralizing layer in the first area and a second surface of the stress neutralizing layer in the second area that faces the first surface may each have a straight line shape.

A first surface of the stress neutralizing layer in the first area and a second surface of the stress neutralizing layer in the second area that faces the first surface may each have a curved line shape.

A cross-section of the stress neutralizing layer in the bending area may have a parabolic shape.

The stress neutralizing layer in the bending area may include a concavo-convex pattern.

The stress neutralizing layer in the bending area may include a plurality of neutralizing layers separated from each other.

The neutralizing layers may have substantially a same thickness as each other.

The neutralizing layers may have different thicknesses from each other.

The stress neutralizing layer may include an acrylic resin or a urethane-based resin.

The display device may include a controller disposed in the second area.

According to an exemplary embodiment of the present invention, a display device includes a substrate having a first area, a second area, and a bending area between the first area and the second area. A display element is disposed in the first area of the substrate. A stress neutralizing layer is disposed in the first area, the second area and the bending area. The stress neutralizing layer has a thickness in a range of from about 0.1 μm to about 50 μm.

The stress neutralizing layer may have a modulus in a range of from about 350 MPa to about 500 MPa.

The stress neutralizing layer may include an acrylic resin or a urethane-based resin.

BRIEF DESCRIPTION OF THE DRAWINGS

A more complete appreciation of the present invention will become more apparent by describing in detail embodiments thereof with reference to the accompanying drawings, in which.

DETAILED DESCRIPTION

Figure 1:
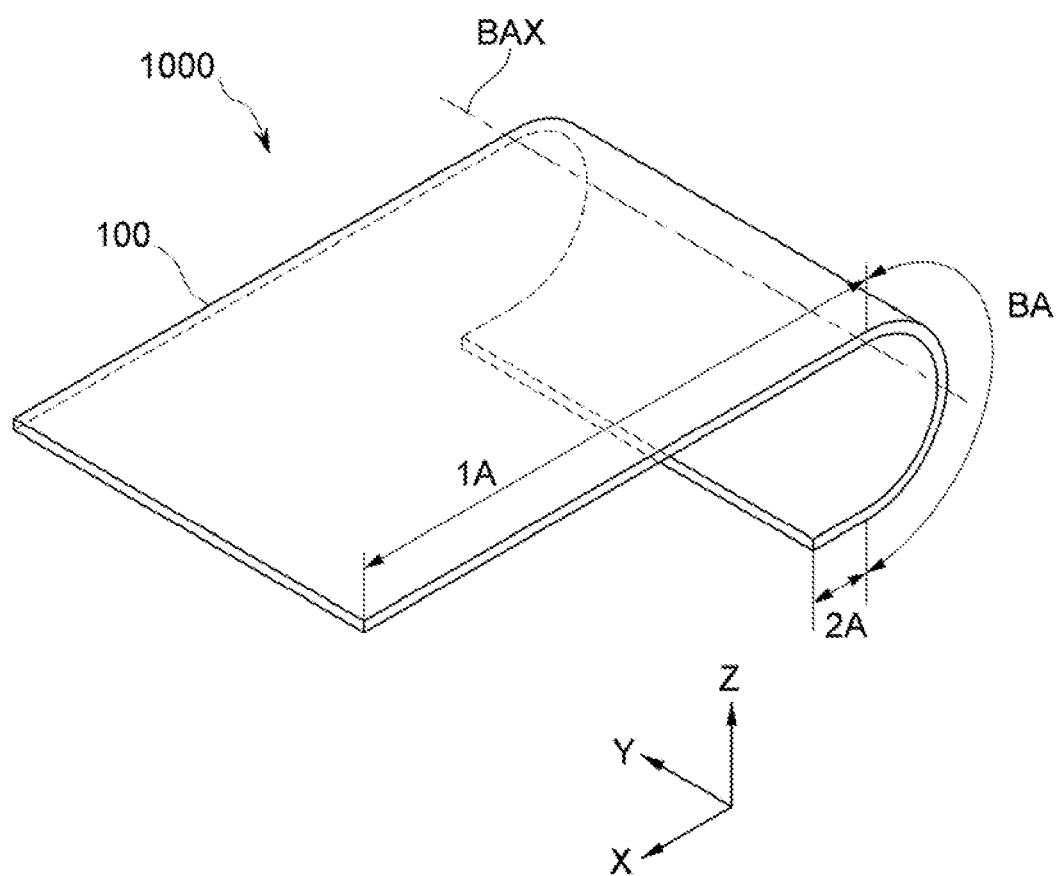
FIG. 1 is a perspective view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

In the drawings, thicknesses of layers (e.g., of a plurality of layers) and areas may be exaggerated for clarity of description. It will be understood that when a component, such as a layer, a film, a region, or a plate, is referred to as being "on" another component, the component may be directly on the other component or intervening components may be present Throughout the specification, when an element is referred to as being "connected" to another element, the element may be "directly connected" to the other element, or "electrically connected" to the other element with one or more intervening elements disposed therebetween.

It will be understood that although the terms "first" and "second" may be used herein to describe various components, these components should not be limited by these terms.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

A display device according to an exemplary embodiment of the present invention and a method of manufacturing the display device will be described in more detail below with reference to the figures.

Figure 2:
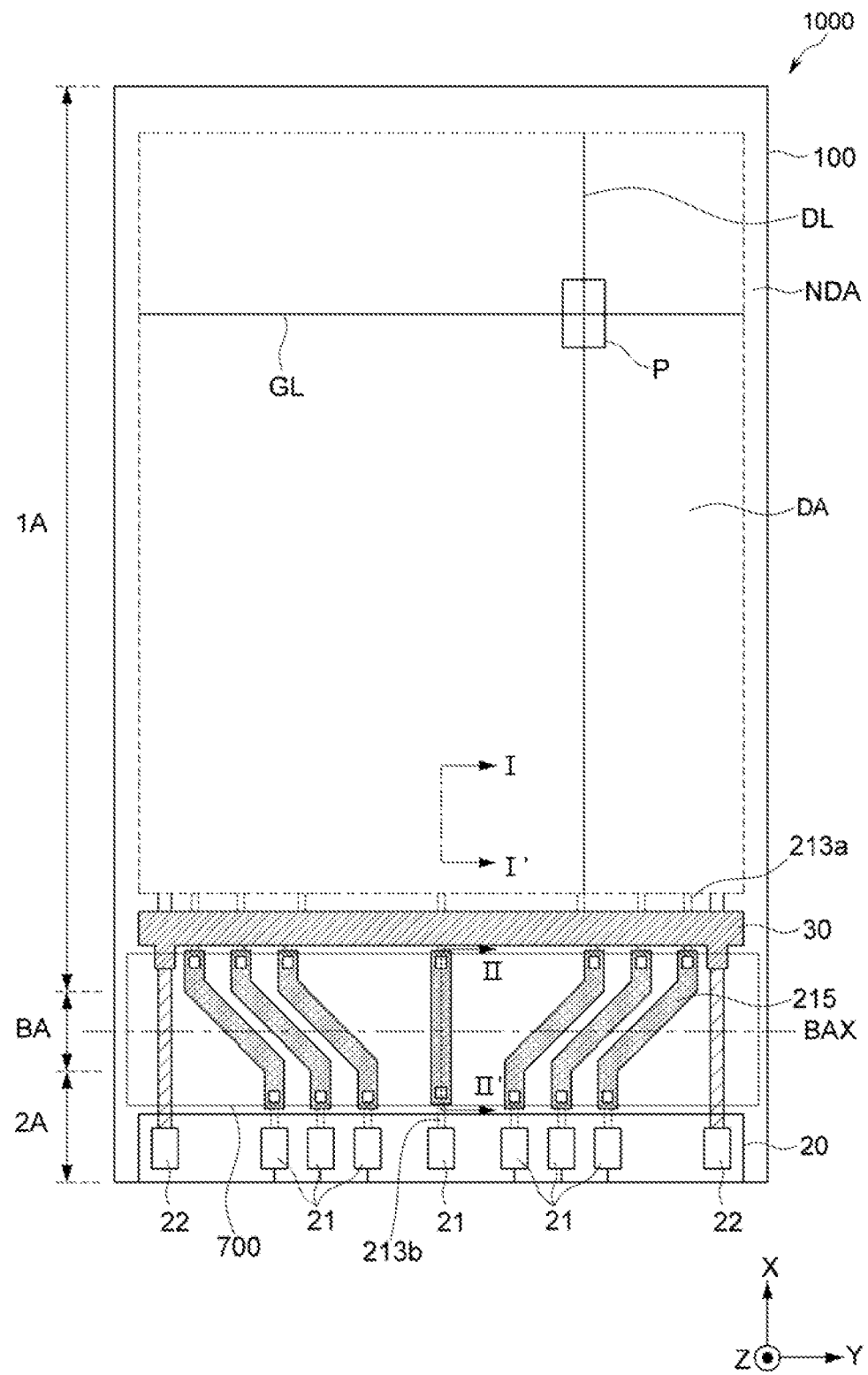
FIG. 2 is a plan view of the display device of FIG. 1.
Figure 3:
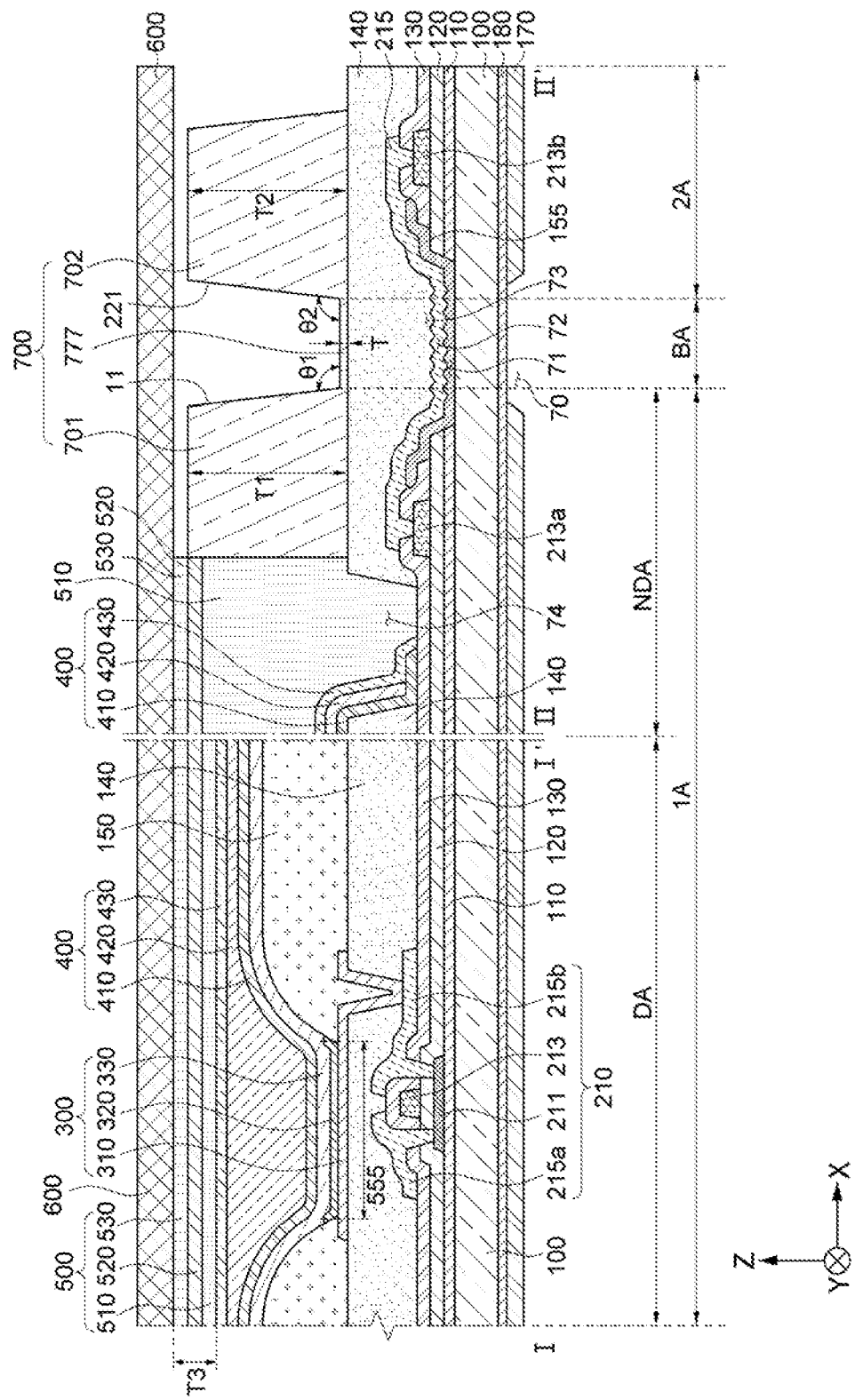
FIG. 3 is a cross-sectional view taken along line I-I' and line II-II' in FIG. 2.

FIG. 1 is a perspective view of a display device according to an exemplary embodiment of the present invention. FIG. 2 is a plan view of the display device of FIG. 1. FIG. 3 is a cross-sectional view taken along line I-I' and line II-II' in FIG. 2.

Referring to FIGS. 1 to 3, a display device 1000 according to an exemplary embodiment of the present invention may have a bent shape. For example, the display device 1000 may include a substrate 100, and the substrate 100 may have a bent shape. Referring to FIGS. 2 and 3, the display device is illustrated in the state that it is not bent for clarity of description. As an example, the display device 1000 may be a bendable or foldable display device that is in a curved or bent state at some times and is in a substantially flat state at other times. Alternatively, the display device 1000 may be in a permanently folded, curved or bent state.

The substrate 100 may include a first area 1A, a second area 2A, and a bending area BA. The bending area BA is disposed between the first area 1A and the second area 2A.

The first area 1A of the substrate 100 may have a quadrangular shape. For example, the substrate 100 may have a square or rectangular shape when viewed in a plan view.

The second area 2A of the substrate 100 may have a quadrangular shape. In an exemplary embodiment of the present invention, the second area 2A may have an area less than that of the first area 1A. For example, a width of the first area 1A and a width of the second area 2A may be substantially equal to each other, and a length of the first area 1A may be greater than a length of the second area 2A. As used herein, the width of the first and second areas 1A and 2A may refer to the size of the first and second areas 1A and 2A in a Y-axis direction, and each length of the first and second areas 1A and 2A means each size of the first and second areas 1A and 2A in an X-axis direction. A part of the second area 2A of the bent substrate 100 may overlap a part of the first area 1A. For example, the second area 2A may overlap the first area 1A in the Z-axis direction.

As an example, the X-axis direction may be perpendicular to the Y-axis direction. The X-axis direction and the Y-axis direction may define a plane along which the display device 1000 extends. The Z-axis direction may be perpendicular to the X-axis direction and the Y-axis direction. Thus, the Z-axis direction may be orthogonal to a plane extending in the X-axis direction and the Y-axis direction.

The bending area BA of the substrate 100 may have a quadrangular shape that is bent with respect to a bending axis BAX. The bending axis BAX may be parallel to the Y axis and may be located substantially at the center of the bending area BA. The bending area BA of the substrate 100 may have a semicircular, U-shaped, or C-shaped cross-section. The bending area BA may have an area larger than that of the second area 2A and less than that of the first area 1A.

The substrate 100 may be consistently bent with the same radius of curvature about the bending axis BAX. In an exemplary embodiment of the present invention, however, the substrate 100 may be bent with a non-constant radius of curvature about the bending axis BAX.

The first area 1A of the substrate 100 may include a display area DA where an image is displayed and a non-display area NDA where is the images is not displayed. The non-display area NDA may be located at the edge of the first area 1A. In an exemplary embodiment of the present invention, the non-display area NDA may have a shape surrounding the display area DA. As an example, the non-display region NDA may be arranged at four sides of the display region DA in a plan view; however, exemplary embodiments of the present invention are not limited thereto. For example, the non-display region NDA may be arranged at less than four sides (e.g., three sides) of the display region DA in a plan view (e.g., along the Z-axis direction).

The bending area BA and the second area 2A may be in positions corresponding to the non-display area NDA. Accordingly, a part of the first area 1A other than the display area DA, the bending area BA and the second area 2A may be the non-display area NDA.

In the display area DA may be disposed a plurality of pixels P for displaying images, a gate line GL for transferring a gate signal, a data line DL for transferring a data signal, a driving power line 30 for transmitting a driving power, and a common power line for transmitting a common voltage.

The plurality of pixels P may be disposed on the substrate 100 in various patterns such as a stripe pattern or a pentile pattern. As an example, the pixels P may be spaced apart from each other or may be immediately adjacent to each other. The pixels P may be arranged in a plurality of rows and columns on or above an underlying substrate. Thus, the pixels P may be arranged in a matrix configuration.

The pixel P may be electrically connected to the gate line GL, the data line DL, the driving power line 30 and the common power line. The pixel P may include elements such as a switching element, a display element, and a capacitor. The switching element may be a thin film transistor. The display element may be a light emitting diode ("LED"), e.g., an organic light emitting diode ("OLED"). As an example the pixel P or a plurality of pixels P may be referred to as a "display element" herein.

The pixel P is activated in accordance with the gate signal from the gate line GL. Based on the data signal from the data line DL, the driving voltage from the driving power line 30, and the common voltage from the common power line, the switching element of the activated pixel P generates a driving current having a magnitude corresponding to the data signal. The driving current may be applied to the LED. The LED may emit light at a luminance corresponding to the magnitude of the driving current.

The gate line GL, the data line DL, the driving power line 30 and the common power line may be connected to a terminal portion 20 through a connection line 215 arranged in the non-display area NDA.

The terminal portion 20 may be disposed in the second area 2A. The terminal portion 20 may include a plurality of terminals 21 and 22. The terminal portion 20 may be exposed to the outside without being covered by an insulating layer.

The terminal portion 20 may be connected to a controller (e.g., controller 900 described in more detail below). Accordingly, the gate line GL, the data line DL, the driving power line 30 and the common power line may be connected to the controller through the connection line 215 and the terminal portion 20.

The controller may provide the gate signal, the data signal, the driving voltage, and/or the common voltage. The controller may include, for example, a driving circuit or a circuit board. The driving circuit may be a driving integrated circuit, and the circuit board may be a flexible printed circuit board.

The terminal 22 may be a driving terminal, and thus the terminal 22 may be interchangeably referred to as a driving terminal 22. The driving power line 30 may be connected to the controller through the driving terminal 22. The driving power line 30 may provide the driving voltage from the controller to the pixels P. The driving power line 30 may be disposed in the non-display area NDA. In an exemplary embodiment of the present invention, the connection lines 215 for applying the data signal or the gate signal to the non-display area NDA may intersect the driving power line 30. In an exemplary embodiment of the present invention, the connection lines 215 may be connected to lines of another layer through contact holes.

A vertical structure of a display device according to an exemplary embodiment of the present invention will be described in more detail below with reference to FIG. 3.

Referring to FIG. 3, the display device 1000 may include a protective film 170, an adhesive layer 180, a substrate 100, a buffer layer 110, a switching element 210, a gate insulating layer 120, a first conductive layer 213a, a second conductive layer 213b, an insulating interlayer 130, an organic layer 155, a connection line 215, a planarization layer 140, an LED 300, a pixel defining layer 150, a sealing member 400, a polarizing member 500, a window 600, and a stress neutralizing layer 700.

Two surfaces of the substrate 100 may oppose each other in a Z-axis direction. One of the two surfaces that is closer to the polarizing member 500 may be defined as an upper surface of the substrate 100, and the other of the two surfaces may be defined as a lower surface of the substrate 100.

The protective film 170 may be disposed on the lower surface of the substrate 100. The protective film 170 may be attached to the lower surface of the substrate 100. The protective film 170 may have an opening 70. The opening 70 of the protective film 170 may be positioned in the bending area BA. The opening 70 may expose a bottom surface of the adhesive layer 180. As an example, the protective film 170 may be disposed on the lower surface of the substrate 100 except in the bending area BA. The opening 70 may expand to portions of the first area 1A and the second area 2A. The opening 70 of the protective film 170 may be defined by a laser process. For example, the opening 70 of the protective film 170 may be defined through laser irradiation at a portion of the protective film 170, attached to the lower surface of the substrate 100, in the bending area BA. The protective film 170 may include polyethyleneterephthalate ("PET").

The adhesive layer 180 may be disposed on (e.g., may be in direct contact with) the protective film 170. For example, the adhesive layer 180 may be disposed between the protective film 170 and the substrate 100. The protective film 170 may be attached to the lower surface of the substrate 100 by the adhesive layer 180. The adhesive layer 180 may substantially prevent the substrate 100 from being irradiated with the laser beam when the opening 70 of the protective film 170 is defined by the laser. For example, the substrate 100 may be substantially prevented from being damaged through the use of the adhesive layer 180. The adhesive layer 180 may include, for example, a pressure sensitive adhesive (PSA).

In an exemplary embodiment of the present invention, the adhesive layer 180 may have an opening. The opening of the adhesive layer 180 may face the opening of the protective film 170. As an example, the opening of the adhesive layer 180 is positioned corresponding to the opening of the protective film 170. In an exemplary embodiment of the present invention, the lower surface of the substrate 100 may be exposed to the outside through the opening of the adhesive layer 180.

The time when the protective film 170 is attached to the lower surface of the substrate 100 may vary, such as depending on a manufacturing process of the display device 1000. For example, when a plurality of display devices are manufactured from one mother substrate, to facilitate transferring of the mother substrate having flexible or bendable characteristics during its manufacturing process, a carrier substrate including a rigid material may be attached under the mother substrate. After a plurality of substrates and the sealing member 400 for sealing the plurality of substrates are formed on the mother substrate, the carrier substrate may be detached from the mother substrate. As an example, after a touch electrode is positioned, a touch protection layer for protecting the touch electrode may be formed on the sealing member 400, and the carrier substrate may be detached from the mother substrate. As an example, after the carrier substrate is separated from the mother substrate, the protective film 170 may be attached to a surface of the mother substrate that faces the carrier substrate, and in such a state, the mother substrate and the protective film 170 may be cut, and thus a plurality of display devices may be obtained.

After the plurality of display devices are obtained by the cutting process of the mother substrate to which the protective film 170 is attached, the polarizing member 500 may be attached on the sealing member 400, and thus, the controller may be attached in the second area 2A. In the case where there is a touch electrode or a touch protection layer on the sealing member 400, the polarizing member 500 may be disposed on such components. In addition, the stress neutralizing layer 700 may be located outside the display area DA.

As an example display devices may be manufactured from one substrate 100 rather than the mother substrate. In an exemplary embodiment of the present invention, to facilitate transferring of the substrate 100 having flexible or bendable characteristics during its manufacturing process, a carrier substrate including a rigid material may also be attached under the substrate 100. After the sealing member 400 is formed on the substrate 100, the carrier substrate may be detached from the substrate 100. As an example, after a touch electrode is positioned, a touch protection layer for protecting the touch electrode may be formed on the sealing member 400, and the carrier substrate may be detached from the substrate 100. As an example, after the carrier substrate is separated from the substrate 100, the protective film 170 may be attached to a surface of the substrate 100 that faces the carrier substrate, and in such a state, the substrate 100 and the protective film 170 may be cut, and thus a plurality of display devices may be obtained.

After the plurality of display devices are obtained by the cutting process of the substrate 100 to which the protective film 170 is attached, the polarizing member 500 may be attached on the sealing member 400, and thus, the controller may be attached in the second area 2A. In the case where there is a touch electrode or a touch protection layer on the sealing member 400, the polarizing member 500 may be disposed on such components. In addition, the stress neutralizing layer 700 may be located outside the display area DA.

The substrate 100 may be disposed on the adhesive layer 180. For example, the substrate 100 may be positioned between the adhesive layer 180 and the buffer layer 110. The substrate 100 may include various materials having flexible or bendable characteristics. For example, the substrate 100 may include a polymer resin such as polyethersulphone (PES), polyacrylate (PAR), polyetherimide (PEI), polyethylene naphthalate (PEN), polyethyleneterephthalate (PET), polyphenylene sulfide (PPS), polyallylate, polyimide (PI), polycarbonate (PC) or cellulose acetate propionate (CAP). The substrate 100 may have a single-layer or multi-layer structure including the above-mentioned materials, and in the case of a multi-layer structure, the substrate 100 may further include an inorganic layer in addition to the above-mentioned materials.

The buffer layer 110 may be disposed on the substrate 100. The buffer layer 110 may increase the flatness of the upper surface of the substrate 100, or reduce or substantially prevent the impurities from the substrate 100 from penetrating into a semiconductor layer 211. The buffer layer 110 may have an opening 71. The opening 71 of the buffer layer 110 may face the opening 70 of the protective film 170. As an example, the opening 71 of the buffer layer 110 may be positioned corresponding to the opening 70 of the protective film 170. The opening 71 of the buffer layer 110 may be larger than the opening 70 of the protective film 170. The buffer layer 110 may include at least one inorganic material such as silicon oxide, silicon nitride, or silicon oxynitride. The buffer layer 110 may be omitted.

The switching element 210 may be disposed on the buffer layer 110 in the first area 1A. For example, the switching element 210 may be disposed on the buffer layer 110 in the display area DA included in the first area 1A. The switching element 210 may include a semiconductor layer 211, a gate electrode 213, a source electrode 215a, and a drain electrode 215b.

The semiconductor layer 211 may be disposed on the buffer layer 110 in the first area 1A. For example, the semiconductor layer 211 may be disposed on the buffer layer 110 in the display area DA included in the first area 1A. The semiconductor layer 211 may include at least one of the followings: a polycrystalline silicon layer, an amorphous silicon layer and an oxide semiconductor such as indium gallium zinc oxide (IGZO) or indium zinc tin oxide (IZTO). For example, when the semiconductor layer 211 includes a polycrystalline silicon layer, the semiconductor layer 211 may include a channel area which is not doped with impurities and p+ doped source and drain areas which are formed on opposite sides of the channel area. In such a case, p-type impurities, such as boron B, may be used as dopant ions and $B_2H_6$ may be used. Such impurities may vary depending on the kinds of switching elements.

The gate insulating layer 120 may be disposed on the semiconductor layer 211 and the buffer layer 110. The gate insulating layer 120 may have an opening 72. The opening 72 of the gate insulating layer 120 may face the opening 70 of the protective film 170. As an example, the opening 72 of the gate insulating layer 120 may be positioned corresponding to the opening 70 of the protective film 170. The opening 72 of the gate insulating layer 120 may be larger than the opening 70 of the protective film 170 and the opening 71 of the buffer layer 110. The gate insulating layer 120 may include at least one of: tetraethylorthosilicate (TEOS), silicon nitride ($SiN_x$) or silicon oxide ($SiO_2$). For example, the gate insulating layer 120 may have a double-layer structure where a $SiN_x$ layer having a thickness of about 40 nm and a TEOS layer having a thickness of about 80 nm are sequentially stacked.

The gate electrode 213 may be disposed on the gate insulating layer 120 in the first area 1A. For example, the gate electrode 213 may be disposed on the gate insulating layer 120 in the display area DA included in the first area 1A. The gate electrode 213 may overlap a portion of the semiconductor layer 211 (e.g., along the Z-axis direction). For example, the gate electrode 213 may be disposed on the gate insulating layer 120 to overlap the channel area of the semiconductor layer 211 (e.g., along the Z-axis direction). The gate electrode 213 may serve to substantially prevent impurities from being doped into the channel area when the impurity is doped in the source area and the drain area of the semiconductor layer 211 in the process of forming the semiconductor layer 211. The gate electrode 213 may include at least one of molybdenum (Mo), chromium (Cr) or tungsten (W).

The first conductive layer 213a may be disposed on the gate insulating layer 120 in the first area 1A. For example, the first conductive layer 213a may be disposed on the gate insulating layer 120 in the non-display area DA included in the first area 1A. The first conductive layer 213a may be connected to the switching element 210. The first conductive layer 213a may include a same material as a material included in the gate electrode 213.

The second conductive layer 213b may be disposed on the gate insulating layer 120 in the second area 2A. The second conductive layer 213b may include a same material as a material included in the gate electrode 213.

The insulating interlayer 130 may be s disposed on the gate electrode 213, the first conductive layer 213a, the second conductive layer 213b, and the gate insulating layer 120. The insulating interlayer 130 may have an opening 73. The opening 73 of the insulating interlayer 130 may face the opening 70 of the protective film 170. As an example, the opening 73 of the insulating interlayer 130 may be positioned corresponding to the opening 70 of the protective film 170. The opening 73 of the insulating interlayer 130 may be larger than the opening 70 of the protective film 170, the opening 71 of the buffer layer 110 and the opening 72 of the gate insulating layer 120. The insulating interlayer 130 may include a same material as a material included in the gate insulating layer 120.

The organic layer 155 may be disposed in the non-display area NDA of the first area 1A, the bending area BA, and the second area 2A. For example, the organic layer 155 may be disposed at the opening 71 of the buffer layer 110, the opening 72 of the gate insulating layer 120, and the opening 73 of the insulating interlayer 130. A part of the organic layer 155 may be disposed on the upper surface portion of the substrate 100 that is exposed by the opening 71 of the buffer layer 110.

The source electrode 215a and the drain electrode 215b may be disposed on (e.g., may be in direct contact with) the insulating interlayer 130 in the first area 1A. For example, the source electrode 215a and the drain electrode 215b may be disposed on the insulating interlayer 130 in the display area DA included in the first area 1A. The source electrode 215a may be connected to the source area of the semiconductor layer 211 through a source contact hole defined through the insulating interlayer 130 and the gate insulating layer 120, and the drain electrode 215b may be connected to the drain area of the semiconductor layer 211 through a drain contact hole defined through the insulating interlayer 130 and the gate insulating layer 120. The source electrode 215a may include or be formed of a refractory metal, such as molybdenum, chromium, tantalum, titanium, and/or an alloy thereof. The source electrode 215a may have a multilayer structure including a refractory metal layer and a low resistance conductive layer. Examples of the multilayer structure may include: a double-layer structure including a chromium or molybdenum (alloy) lower layer and an aluminum (alloy) upper layer; or a triple-layer structure including a molybdenum (alloy) lower layer, an aluminum (alloy) intermediate layer, and a molybdenum (alloy) upper layer. In an exemplary embodiment of the present invention, the source electrode 215a may include or be formed of any desired metals and/or conductors rather than the aforementioned materials. The drain electrode 215b and the source electrode 215a may include a same material as each other and may have substantially a same structure as each other.

The connection line 215 may be disposed on the insulating interlayer 130 and the organic layer 155 in the first area 1A, the bending area BA and the second area 2A. For example, the connection line 215 may be disposed on the insulating interlayer 130 and the organic layer 155 in the non-display area NDA, the bending area BA, and the second area 2A. The connection line 215 may be connected to each of the first conductive layer 213a and the second conductive layer 213b through contact holes defined through the insulating interlayer 130. As an example, the connection line 215 may electrically connect the first conductive layer 213a and the second conductive layer 213b to each other. The connection line 215 and the source electrode 215a may include a same material as each other and may have substantially a same structure as each other. As an example, the connection line 215 and the source electrode 215a may be substantially simultaneously formed by a same process, and by using a same material.

The planarization layer 140 may be disposed on the source electrode 215a, the drain electrode 215b, the connection line 215, and the insulating interlayer 130. The planarization layer 140 may eliminate the height difference between components disposed between the planarization layer 140 and the substrate 100 to provide a substantially flat surface. The luminous efficiency of the LED 300 may be increased by the planarization layer 140. The planarization layer 140 in the non-display area NDA of the first area 1A may have an opening 74. The insulating interlayer 130 may be exposed by the openings 74 of the planarization layer 140. The planarization layer 140 may include at least one of: a polyacrylate resin, an epoxy resin, a phenolic resin, a polyamide resin, a polyimide resin, an unsaturated polyester resin, a polyphenylene ether resin, a polyphenylene sulfide resin or benzocyclobutene (BCB).

The LED 300 may be disposed on the planarization layer 140 in the first area 1A. For example, the LED 300 may be disposed on the planarization layer 140 in the display area DA included in the first area 1A. The LED 300 may include a first electrode 310 (which may be referred to interchangeably herein as "a pixel electrode"), a light emitting layer 320, and a second electrode 330 (which may be referred to interchangeably herein as a "common electrode").

The pixel electrode 310 may be disposed on the planarization layer 140 in the first area 1A. For example, the pixel electrode 310 may be disposed on the planarization layer 140 in the display area DA included in the first area 1A. The pixel electrode 310 may be connected to the drain electrode 215b through the contact hole of the planarization layer 140. Part or all of the pixel electrode 310 may be disposed in a pixel area 555. For example, the pixel electrode 310 may completely overlap the pixel area 555 in a plan view (e.g., along the Z-axis direction). For example, the pixel electrode 310 may be disposed in the pixel area 555 that is defined by the pixel defining layer 150.

The pixel defining layer 150 may be disposed on the planarization layer 140 in the first area 1A. In addition, the pixel defining layer 150 may be further disposed on the edge of the pixel electrode 310. The pixel area 555 defined by the pixel defining layer 150 may be located in the display area DA of the first area 1A. The pixel defining layer 150 may include a resin such as a polyacrylate resin or a polyimide resin.

A light emitting layer 320 may be disposed on the pixel electrode 310 in the pixel area 555. The light emitting layer 320 may be positioned between the pixel electrode 310 and the common electrode 330. The light emitting layer 320 may include a relatively low molecular weight organic material or a relatively high molecular weight organic material. At least one of a hole injection layer HIL or a hole transporting layer HTL may further be disposed between the pixel electrode 310 and the light emitting layer 320, and at least one of an electron transporting layer ETL or an electron injection layer EIL may further be disposed between the light emitting layer 320 and the common electrode 330.

The common electrode 330 may be disposed on the light emitting layer 320 and the pixel defining layer 150. The common electrode 330 may be located in the first area 1A. The common electrode 330 may be connected to the common power line.

The pixel electrode 310 or the common electrode 330 may each be a transmissive electrode, a transflective electrode, or a reflective electrode. Transparent conductive oxide (TCO) may be included in the transparent electrode. The TCO may include at least one of: indium tin oxide (ITO), indium zinc oxide (IZO), antimony tin oxide (ATO), aluminum zinc oxide (AZO), zinc oxide (ZnO), or mixtures thereof. The transflective electrode or the reflective electrode may include a metal, e.g., magnesium (Mg), silver (Ag), gold (Au), calcium (Ca), lithium (Li), chromium (Cr), aluminum (Al) or copper (Cu), or an alloy thereof. As an example, whether an electrode is a transflective type or a reflective type may depend on the thickness of the electrode. For example, the transflective electrode may have a thickness of about 200 nm or less, and the reflective electrode may have a thickness of about 300 nm or more. As the thickness of the transflective electrode decreases, light transmittance and resistance may increase. On the other hand, as the thickness of the transflective electrode increases, light transmittance may decrease. In addition, the transflective electrode and the reflective electrode may each have a multilayer structure which includes a metal layer including a metal or a metal alloy and a TCO layer stacked on the metal layer.

The sealing member 400 may be disposed on the common electrode 330. The sealing member 400 may be located on the first area 1A. The sealing member 400 may be a transparent insulating substrate including glass or transparent plastic. In addition, the sealing member 400 may have a thin-film encapsulation structure in which at least one inorganic layer and at least one organic layer are alternately stacked. For example, the sealing member 400 may include a first inorganic layer 410, an organic layer 420 on (e.g., in direct contact with) the first inorganic layer 410, and a second inorganic layer 430 on (e.g., in direct contact with) the organic layer 420. In the non-display area NDA of the first area 1A, the first inorganic layer 410 and the second inorganic layer 430 of the sealing member 400 may be in direct contact with the insulating interlayer 130 through the opening 74 of the planarization layer 140. In addition, in the non-display area NDA of the first area 1A, an end portion of the first inorganic layer 410 and an end portion the second inorganic layer 430 may be in direct contact with each other.

The polarizing member 500 may be disposed on the sealing member 400. The polarizing member 500 may be located in the first area 1A. The polarizing member 500 may include a first adhesive layer 510, a polarizing plate 520 and a second adhesive layer 530.

The first adhesive layer 510 may be disposed on (e.g., in direct contact with) the second inorganic layer 430 of the sealing member 400, the insulating interlayer 130, and the planarization layer 140. The first adhesive layer 510 in the non-display area NDA may be disposed at the planarization layer 140 and the opening 74 of the planarization layer 140. The first adhesive layer 510 in the non-display area NDA may have a thickness greater than a thickness of the first adhesive layer 510 in the display area DA. As used herein, the thickness of the first adhesive layer 510 may refer to the size of the first adhesive layer 510 in the Z-axis direction. The first adhesive layer 510 may be an optically clear adhesive (OCA). The polarizing plate 520 may be attached to the sealing member 400 by the first adhesive layer 510.

The polarizing plate 520 may be disposed on the first adhesive layer 510. As an example, the polarizing plate 520 may be disposed between the first adhesive layer 510 and the second adhesive layer 530. The polarizing plate 520 may reduce a reflection of external light. For example, the external light may pass through the polarizing plate 520 and may be incident to the common electrode 330, and the external light incident to the common electrode 330 may be reflected from the common electrode 330 and then may proceed to the polarizing plate 520. However, since the external light reflected from the common electrode 330 may be the light that has already passed through the polarizing plate 520 once (e.g., the phase-changed light), such phase-changed external light need not pass through the polarizing plate 520. As an example, the light reflected from the common electrode 330 need not pass through the polarizing plate 520. Accordingly, the reflectance of the external light may be reduced and the image quality may be increased.

The second adhesive layer 530 may be disposed on the polarizing plate 520. As an example, the second adhesive layer 530 may be disposed between the polarizing plate 520 and the window 600. The second adhesive layer 530 may be the optically clear adhesive. The window 600 may be attached to the polarizing plate 520 by the second adhesive layer 530.

The window 600 may be disposed on the second adhesive layer 530. The window 600 may have an opening that is positioned corresponding to the display area DA of the first area 1A.

The stress neutralizing layer 700 may substantially minimize the tensile stress that is applied to the connection line 215 due to bending of the display device 1000. The stress neutralizing layer 700 may include an acrylic resin or a urethane-based resin. The stress neutralizing layer 700 may be disposed at the bending area BA of the substrate and areas of the substrate adjacent to the bending area BA. As described in more detail below, the stress neutralizing layer in the bending area BA may have a thickness less than a thickness of the stress neutralizing layer in the adjacent areas. Accordingly, the tensile stress in the bending area BA may be reduced. Accordingly, cracking of the insulating layer or the signal line in the bending area BA may be reduced or eliminated. In addition, the tensile stress of the stress neutralizing layer 700 in the bending area may be reduced, and thus the bending area may have a smaller radius of curvature. Accordingly, the size of the display device (e.g., display device 1000) may be reduced. For example, the display device according to an exemplary embodiment of the present invention may be relatively slim or thin. The stress neutralizing layer 700 (e.g., the thickness of a stress neutralizing layer 700 in a state where the display device of FIG. 3 is bent) will be described in more detail below with reference to FIGS. 3 and 4.

Figure 4:
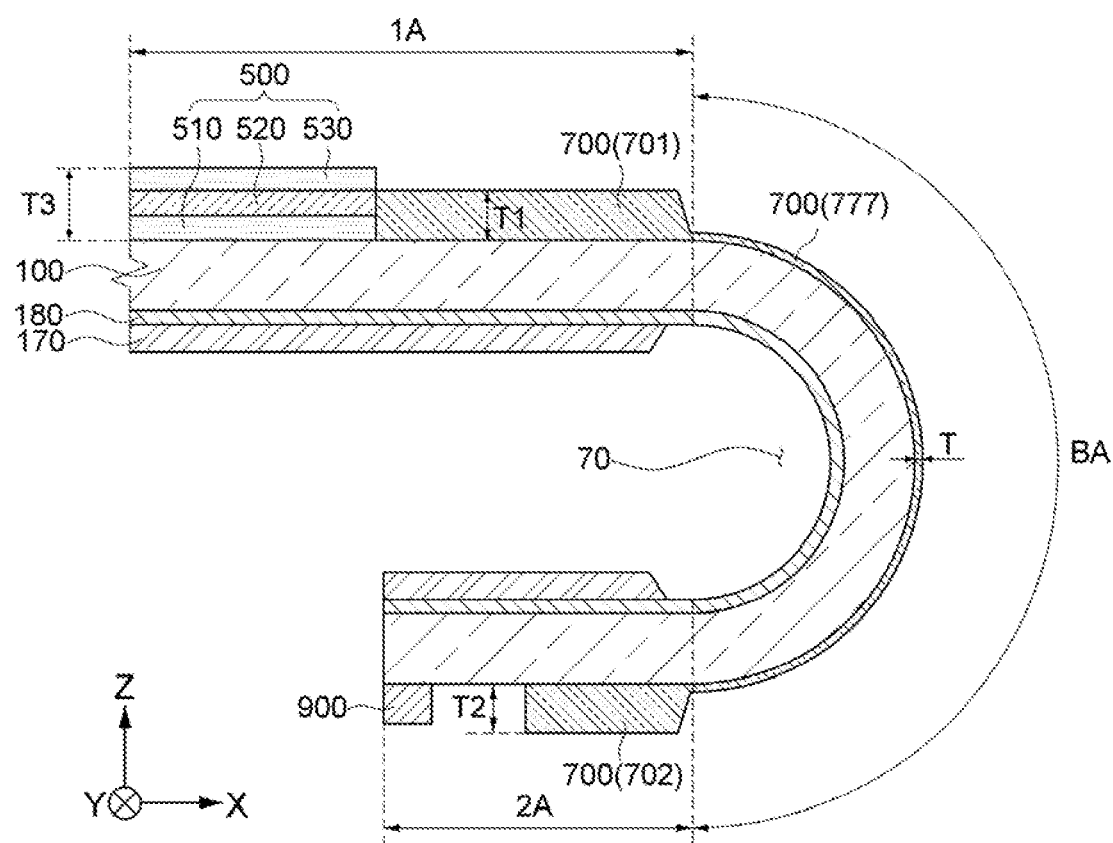
FIG. 4 is a side view of a stress neutralizing layer in a state in which the display device of FIG. 3 is bent.

FIG. 4 is a side view of a stress neutralizing layer in a state in which the display device of FIG. 3 is bent.

Referring to FIGS. 3 and 4, the stress neutralizing layer 700 may be disposed on the planarization layer 140 in the first area 1A, the bending area BA, and the second area 2A. As an example, the stress neutralizing layer 700 may be continuously formed in the first area 1A, the bending area BA, and the second area 2. For example, the stress neutralizing layer 700 may be disposed on (e.g., may be in direct contact with) the planarization layer 140 in the non-display area, the bending area BA, and the second area 2A. In an exemplary embodiment of the present invention, the stress neutralizing layer 700 may overlap the first conductive layer 213a, the second conductive layer 213b, and the connection line 215 (e.g., along the Z-axis direction when the display device is in an unbent or substantially flat state).

From the viewpoint of the Z-axis direction, the stress neutralizing layer 700 may be disposed between the planarization layer 140 and the window 600. In addition, from the viewpoint of the X-axis direction (see, e.g., FIGS. 2 and 4), the stress neutralizing layer 700 may be disposed between the display area DA and the terminal portion 20. In an exemplary embodiment of the present invention, the controller 900 such as a driving circuit may be disposed at the terminal portion 20, and the stress neutralizing layer 700 may be disposed between the display area DA and the controller 900.

The stress neutralizing layer 700 in the bending area BA may have a thickness (e.g., along the Z-axis direction when the display device is in an unbent or substantially flat state) different from a thickness of the stress neutralizing layer 700 in the first and second areas 1A and 2A. For example, a thickness T of a stress neutralizing layer 777 in the bending area BA may be less than a thickness T1 of a stress neutralizing layer 701 in the first area 1A. In addition, the thickness T of the stress neutralizing layer 777 in the bending area BA may be less than a thickness T2 of a stress neutralizing layer 702 in the second area 2A. For example, the thickness T of the stress neutralizing layer 777 in the bending area BA may be less than about ½ of the thickness T1 or T2 (which may be a maximum thickness of the stress neutralizing layer 700) of the stress neutralizing layers 701 or 702 in at least one of the first and second areas 1A and 2A. As used herein, the thicknesses T, T1, and T2 of the stress neutralizing layer 700 may refer to the size of the stress neutralizing layer 700 in the Z-axis direction. As an example, the stress neutralizing layer 701 may be interchangeably referred to as a first stress neutralizing layer 701, and the stress neutralizing layer 702 may be interchangeably referred to as a second stress neutralizing layer 702.

The stress neutralizing layer 777 in the bending area BA may have substantially the same thickness T in the entire bending area BA, and in an exemplary embodiment of the present invention, the thickness T of the stress neutralizing layer 777 in the bending area BA may be less than the thickness T1 of the stress neutralizing layer 701 in the first area 1A. For example, the thickness T of the stress neutralizing layer 777 in the bending area BA may be less than about ½ the thickness T1 of the stress neutralizing layer 701 in the first area 1A. As an example, the stress neutralizing layer 777 may be interchangeably referred to as a third stress neutralizing layer 777.

The stress neutralizing layer 777 in the bending area BA may have substantially the same thickness T in the entire bending area BA, and in an exemplary embodiment of the present invention, the thickness T of the stress neutralizing layer 777 in the bending area BA may be less than the thickness T2 of the stress neutralizing layer 702 in the second area 2A. For example, the thickness T of the stress neutralizing layer 777 in the bending area BA may be less than about ½ the thickness T2 of the stress neutralizing layer 702 in the second area 2A.

The thickness T1 of the stress neutralizing layer 701 in the first area 1A may be substantially equal to the thickness T2 of the stress neutralizing layer 702 in the second area 2A.

Although the stress neutralizing layer 777 in the bending area BA may have substantially the same thickness T in the entire bending area BA, in an exemplary embodiment of the present invention, the stress neutralizing layer 777 may have different thicknesses in the bending area BA (e.g., depending on the process condition of manufacturing the stress neutralizing layer 700). The stress neutralizing layer 701 in the first area 1A may also have different thicknesses in the first area 1A, and the stress neutralizing layer 702 in the second area 2A may also have different thicknesses in the second area 2A. In an exemplary embodiment of the present invention, the maximum thickness T of the stress neutralizing layer 777 in the bending area BA may be less than the maximum thickness T1 of the stress neutralizing layer 701 in the first area 1A. In addition, the thickness T of the stress neutralizing layer 777 in the bending area BA may be less than the thickness T2 of the stress neutralizing layer 702 in the second area 2A.

The stress neutralizing layer 777 in the bending area BA may have a thickness less than a thickness of the polarizing member 500 (T<T3). As an example, the thickness T of the stress neutralizing layer 777 in the bending area BA may be less than the total thickness T3 of the thickness of the first adhesive layer 510, the thickness of the polarizing plate 520, and the thickness of the second adhesive layer 530. As used herein, the thickness T3 of the polarizing member 500 may refer to the size of the polarizing member 500 in the Z-axis direction. For example, the thickness T3 of the polarizing member 500 may be the total size of the size of the first adhesive layer 510 in the Z-axis direction, the size of the polarizing plate 520 in the Z-axis direction, and the size of the second adhesive layer 530 in the Z-axis direction.

The thickness T of the stress neutralizing layer 777 in the bending area BA may be, for example, in a range of from about 0.1 μm to about 50 μm.

A modulus of the stress neutralizing layer 777 in the bending area BA may be, for example, in a range of from about 350 MPa to about 500 MPa.

In an exemplary embodiment of the present invention, the thickness T of the stress neutralizing layer 777 in the bending area BA may be, for example, in a range of from about 0.1 μm to about 50 μm, and in such a case, the modulus of the stress neutralizing layer 700 having such a thickness range may be, for example, in a range of from about 350 MPa to about 500 MPa.

The stress neutralizing layer 777 in the bending area BA may have a thickness T that is less than the thickness of the stress neutralizing layer 701 or 702 in one of its adjacent areas (e.g., the first area 1A and the second area 2A). Accordingly, the tensile stress in the bending area may be substantially reduced. Accordingly, an occurrence of cracking of the insulating layer or the signal line in the bending area BA may be reduced or eliminated.

In addition, the tensile stress applied to the stress neutralizing layer 777 in the bending area BA may be reduced, and thus the bending area BA may have a relatively smaller radius of curvature. Accordingly, the size of the display device may be reduced. For example, the display device 1000 according to an exemplary embodiment of the present invention may be relatively slim or thin.

Facing surfaces of the stress neutralizing layer 701 in the first area 1A and the stress neutralizing layer 702 in the second area 2A may be referred to as a first surface 11 and a second surface 221, respectively. The first surface 11 and the second surface 221 may each have a straight line shape. In an exemplary embodiment of the present invention, the first surface 11 and the second surface 221 may be inclined surfaces inclined at a predetermined angle (e.g., not perpendicular) with respect to an upper surface of the stress neutralizing layer 777 in the bending area BA. For example, an angle θ1 between the first surface 11 and the upper surface of the stress neutralizing layer 777 in the bending area BA may be an obtuse angle, and an angle θ2 between the second surface 221 and the upper surface of the stress neutralizing layer 777 in the bending area BA may be an obtuse angle. In an exemplary embodiment of the present invention, the upper surface of the stress neutralizing layer 777 in the bending area BA may be a surface that faces away from a lower surface of the stress neutralizing layer 777 in the bending area BA in the Z-axis direction. The lower surface may be a surface that directly contacts the planarization layer 140.

Descriptions of components (e.g., with respect to FIGS. 5 to 8 below) that are the same or substantially the same as those described above may be omitted below, and thus differences from the exemplary embodiments of the present invention described above may be focused on below. Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicative descriptions may be omitted herein.

Figure 5:
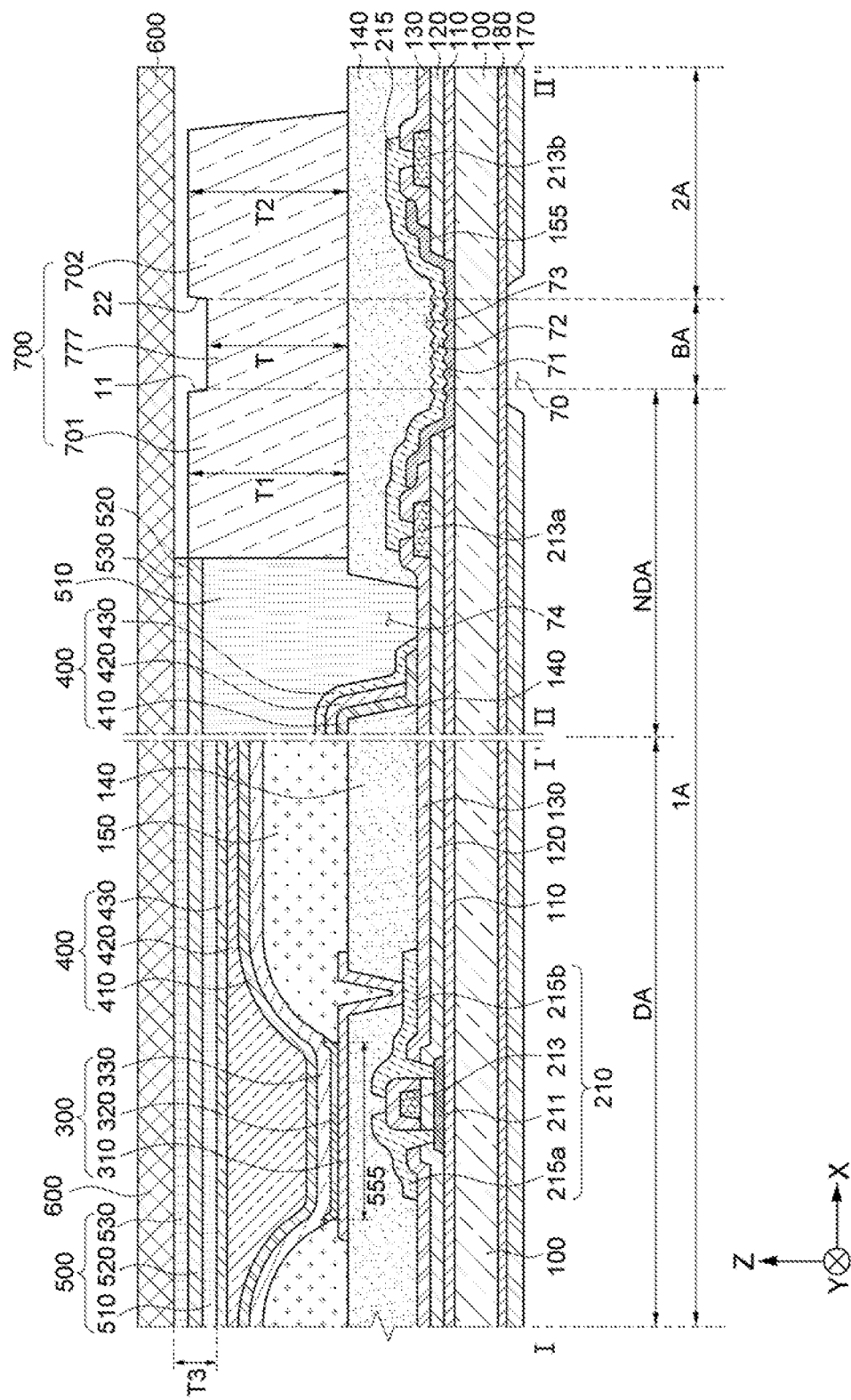
FIG. 5 is a cross-sectional view taken along line I-I' and line II-II' in FIG. 2 according to an exemplary embodiment of the present invention.

FIG. 5 is a cross-sectional view taken along line I-I' and line II-II' in FIG. 2 according to an exemplary embodiment of the present invention.

Referring to FIG. 5, the stress neutralizing layer 700 may be disposed on the planarization layer 140 in the first area 1A, the bending area BA, and the second area 2A. For example, the stress neutralizing layer 700 may be disposed on the planarization layer 140 in the non-display area NDA, the bending area BA, and the second area 2A. In an exemplary embodiment of the present invention, the stress neutralizing layer 700 may overlap the first conductive layer 213a, the second conductive layer 213b, and the connection line 215 (e.g., along the Z-axis direction when the display device is in a substantially flat state).

The stress neutralizing layer 777 in the bending area BA may have a thickness greater than a thickness of the polarizing member 500 (T>T3). As an example, the thickness T of the stress neutralizing layer 777 in the bending area BA may be greater than the total thickness T3 of the thickness of the first adhesive layer 510, the thickness of the polarizing plate 520, and the thickness of the second adhesive layer 530.

The thickness T of the stress neutralizing layer 777 in the bending area BA may be less than a thickness T1 of the stress neutralizing layer 701 in the first area 1A. In addition, the thickness T of the stress neutralizing layer 777 in the bending area BA may be less than a thickness T2 of the stress neutralizing layer 702 in the second area 2A.

The stress neutralizing layer 777 in the bending area BA may have substantially the same thickness T in the entire bending area BA, and in an exemplary embodiment of the present invention, the thickness T of the stress neutralizing layer 777 in the bending area BA may be less than the thickness T1 of the stress neutralizing layer 701 in the first area 1A.

The stress neutralizing layer 777 in the bending area BA may have the same thickness T in the entire bending area BA, and in an exemplary embodiment of the present invention, the thickness T of the stress neutralizing layer 777 in the bending area BA may be less than the thickness T2 of the stress neutralizing layer 702 in the second area 2A.

The thickness T1 of the stress neutralizing layer 701 in the first area 1A may be substantially equal to the thickness 12 of the stress neutralizing layer 702 in the second area 2A.

Although the stress neutralizing layer 777 in the bending area BA may have substantially the same thickness T in the entire bending area BA, in an exemplary embodiment of the present invention, the stress neutralizing layer 777 may have different thicknesses in the bending area BA (e.g., depending on the process condition of manufacturing the stress neutralizing layer 700). The stress neutralizing layer 701 in the first area 1A may also have different thicknesses in the first area 1A, and the stress neutralizing layer 702 in the second area 2A may also have different thicknesses in the second area 2A. In an exemplary embodiment of the present invention, the maximum thickness T of the stress neutralizing layer 777 in the bending area BA may be less than the maximum thickness T1 of the stress neutralizing layer 701 in the first area 1A. In addition, the maximum thickness T of the stress neutralizing layer 777 in the bending area BA may be less than the maximum thickness T2 of the stress neutralizing layer 702 in the second area 2A.

The remaining components of FIG. 5 except the stress neutralizing layer 700 are substantially the same as the components of FIGS. 3 and 4 described above.

Figure 6:
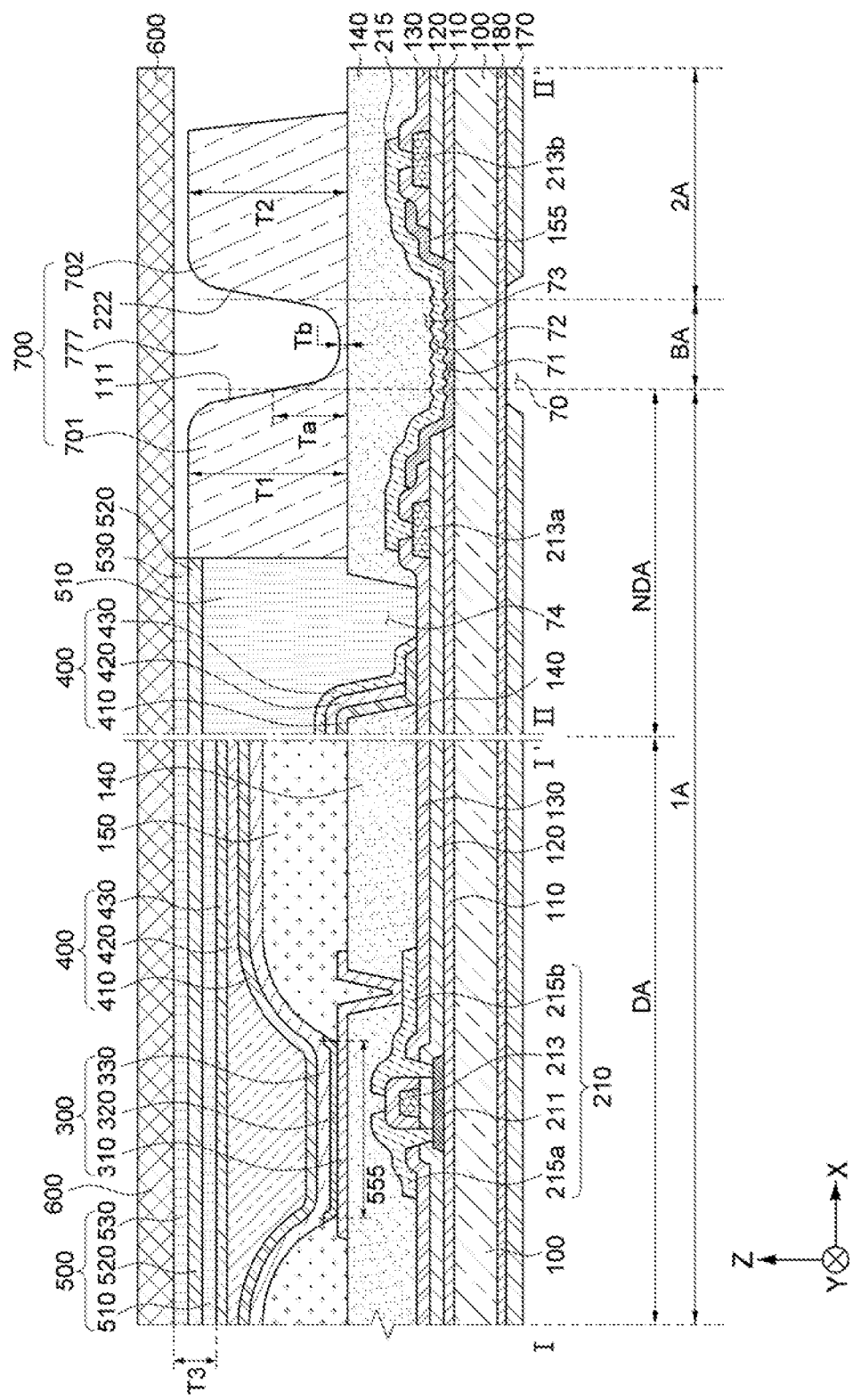
FIG. 6 is a cross-sectional view taken along line I-I' and line II-II' in FIG. 2 according to an exemplary embodiment of the present invention.

FIG. 6 is a cross-sectional view taken along line I-I' and line II-II' in FIG. 2 according to an exemplary embodiment of the present invention.

Referring to FIG. 6, the stress neutralizing layer 700 may be disposed on the planarization layer 140 in the first area 1A, the bending area BA, and the second area 2A. For example, the stress neutralizing layer 700 may be disposed on the planarization layer 140 in the non-display area NDA, the bending area BA, and the second area 2A. In an exemplary embodiment of the present invention, the stress neutralizing layer 700 may overlap the first conductive layer 213a, the second conductive layer 213b, and the connection line 215 (e.g., along the Z-axis direction when the display device is in a substantially flat state).

The cross-section of the stress neutralizing layer 777 in the bending area BA may have a parabolic shape.

A maximum thickness Ta of the stress neutralizing layer 777 in the bending area BA may be less than a maximum thickness T1 of the stress neutralizing layer 701 in the first area 1A.

The maximum thickness Ta of the stress neutralizing layer 777 in the bending area BA may be less than a maximum thickness T2 of the stress neutralizing layer 702 in the second area 2A.

A minimum thickness Tb of the stress neutralizing layer 777 in the bending area BA may be less than a thickness T1 (e.g., a minimum thickness) of the stress neutralizing layer 701 in the first area 1A.

The maximum thickness Tb of the stress neutralizing layer 777 in the bending area BA may be less than a thickness T2 (e.g., a minimum thickness) of the stress neutralizing layer 702 in the second area 2A.

Facing surfaces of the stress neutralizing layer 701 in the first area 1A and the stress neutralizing layer 702 in the second area 2A may be defined as a first surface 111 and a second surface 222, respectively, and the first surface 111 and the second surface 222 may each have a curved line shape.

Figure 7:
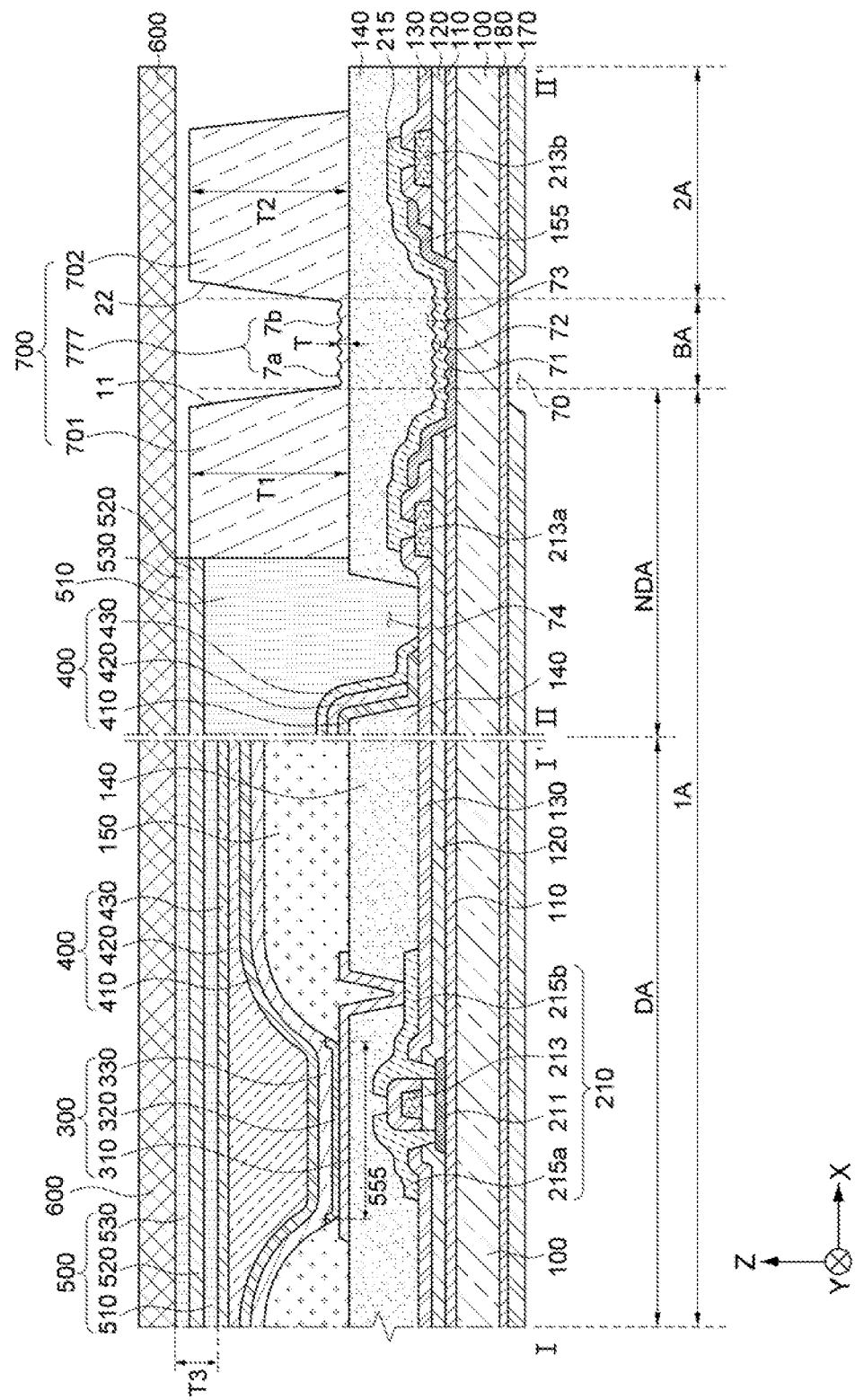
FIG. 7 is a cross-sectional view taken along line I-I' and line II-II' in FIG. 2 according to an exemplary embodiment of the present invention.

FIG. 7 is a cross-sectional view taken along line I-I' and line II-II' in FIG. 2 according to an exemplary embodiment of the present invention.

Referring to FIG. 7, the stress neutralizing layer 700 may be disposed on the planarization layer 140 in the first area 1A, the bending area BA, and the second area 2A. For example, the stress neutralizing layer 700 may be disposed on the planarization layer 140 in the non-display area NDA, the bending area BA, and the second area 2A. In an exemplary embodiment of the present invention, the stress neutralizing layer 700 may overlap the first conductive layer 213a, the second conductive layer 213b, and the connection line 215 (e.g., along the Z-axis direction when the display device is in a substantially flat state).

The stress neutralizing layer 777 in the bending area BA may have a concavo-convex pattern 7a and 7b. For example, the concavo-convex pattern 7a and 7b may be disposed on the upper surface of the stress neutralizing layer 777.

A maximum thickness T of the stress neutralizing layer 777 in the bending area BA may be less than a maximum thickness T1 of the stress neutralizing layer 701 in the first area 1A. For example, the maximum thickness T of the stress neutralizing layer 777 in the bending area BA may be a thickness T of a convex portion 7a of the convex-concave pattern 7a and 7b. As used herein, the thickness T of the convex portion 7a may refer to the size of the convex portion 7a in the Z-axis direction.

The maximum thickness T of the stress neutralizing layer 777 in the bending area BA may be less than a maximum thickness T2 of the stress neutralizing layer 702 in the second area 2A.

Figure 8:
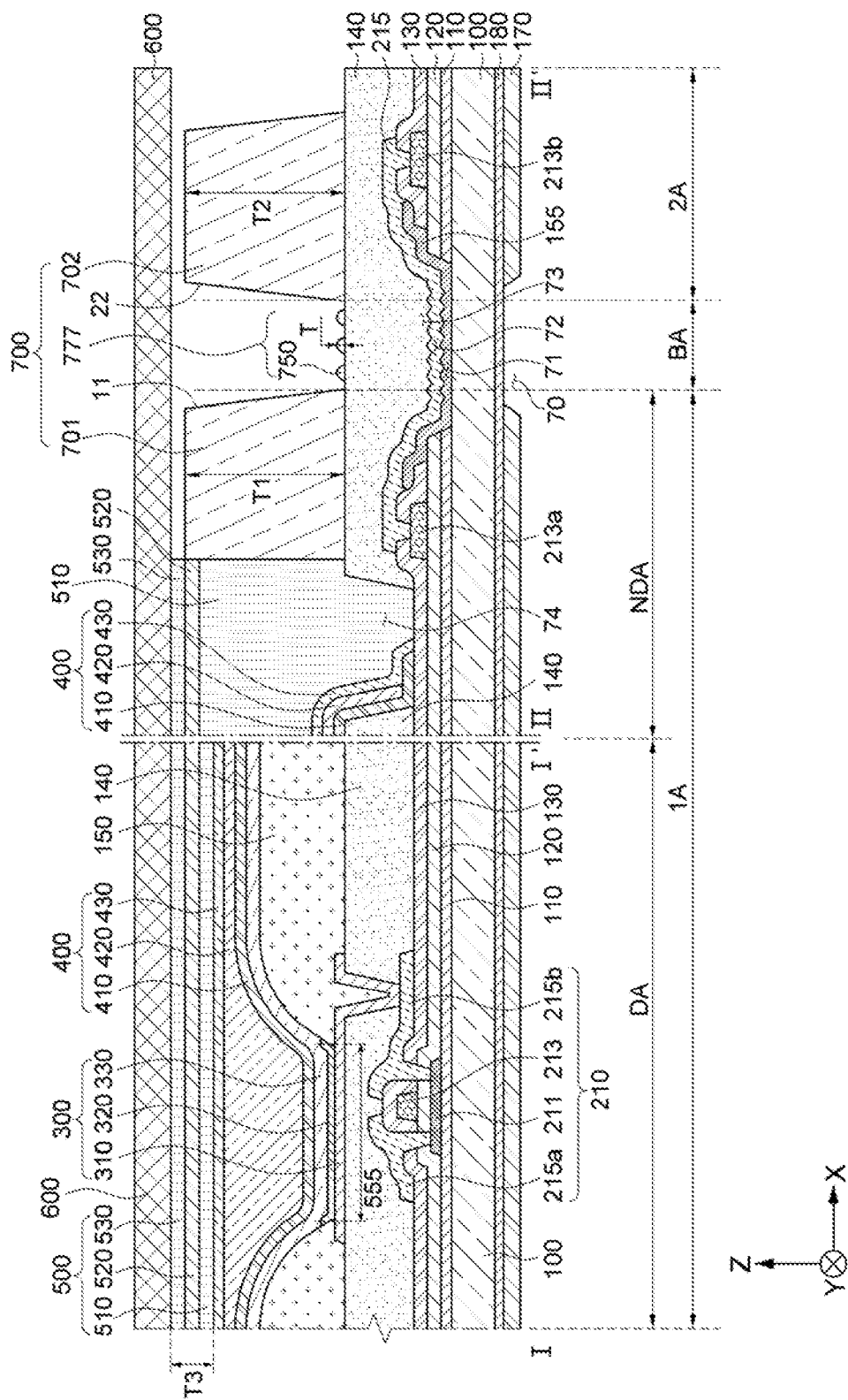
FIG. 8 is a cross-sectional view taken along line I-I' and line II-II' in FIG. 2 according to an exemplary embodiment of the present invention.

FIG. 8 is a cross-sectional view taken along line I-I' and line II-II' in FIG. 2 according to an exemplary embodiment of the present invention.

Referring to FIG. 8, the stress neutralizing layer 700 may be disposed on the planarization layer 140 in the first area 1A, the bending area BA, and the second area 2A. For example, the stress neutralizing layer 700 may be disposed on the planarization layer 140 in the non-display area NDA, the bending area BA, and the second area 2A. In an exemplary embodiment of the present invention, the stress neutralizing layer 700 may overlap the first conductive layer 213a, the second conductive layer 213b, and the connection line 215 (e.g., along the Z-axis direction when the display device is in a substantially flat state).

The stress neutralizing layer 777 in the bending area BA may include a plurality of neutralizing layers 750, which may be separated from each other.

Each neutralizing layer 750 may have substantially the same thickness T (e.g., a maximum thickness) as each other. The thickness of the neutralizing layer may refer to the size of the neutralizing layer in the Z-axis direction. Alternatively, neutralizing layers 750 may have different thicknesses from each other.

The maximum thickness T of the stress neutralizing layer 777 in the bending area BA may be less than a maximum thickness T1 of the stress neutralizing layer 701 in the first area 1A. For example, the maximum thickness T of the stress neutralizing layer 777 in the bending area BA may be the maximum thickness T of the neutralizing layer 750.

The maximum thickness T of the stress neutralizing layer 777 in the bending area BA may be less than a maximum thickness T2 of the stress neutralizing layer 702 in the second area 2A.

Figure 9:
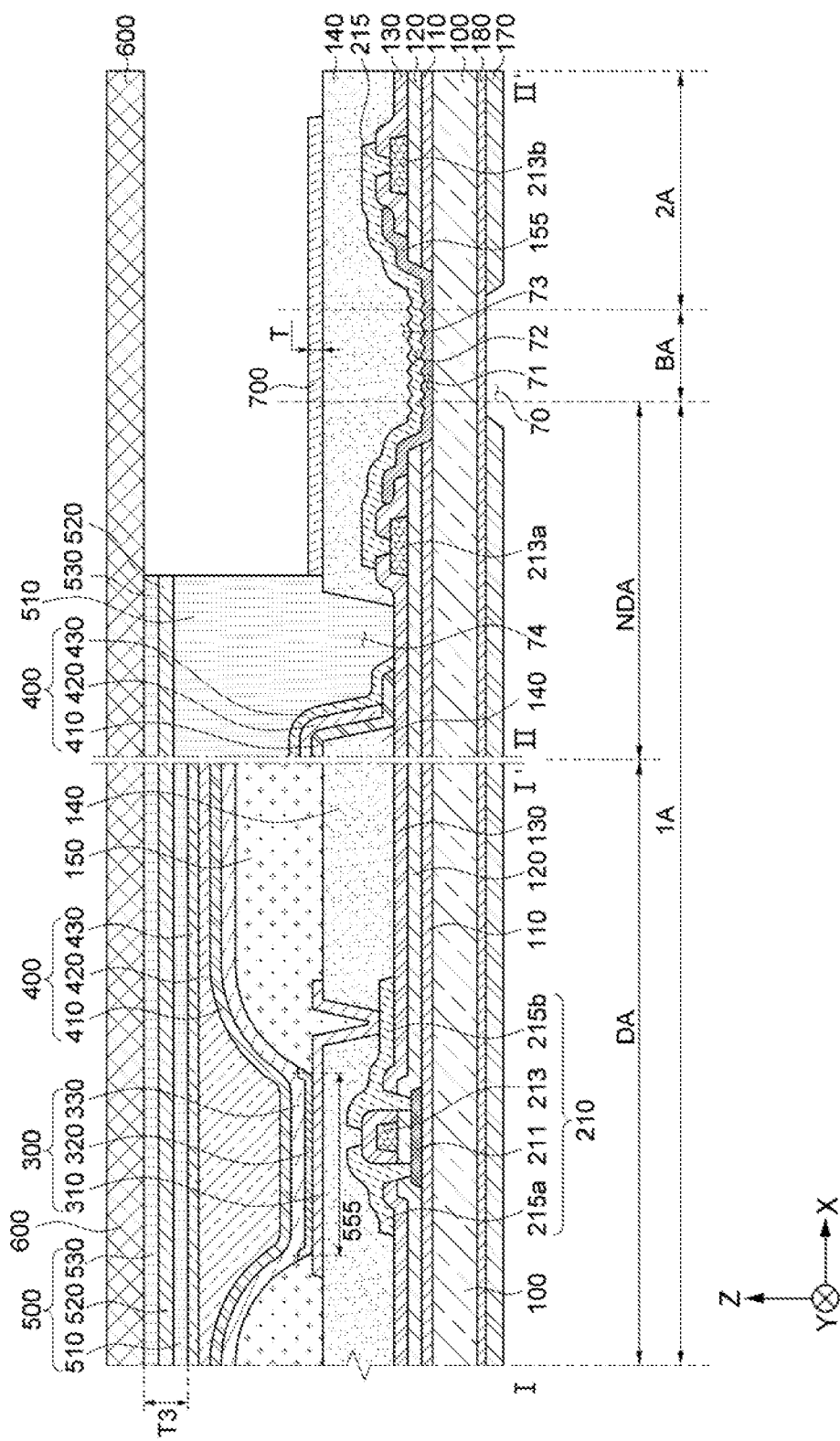
FIG. 9 is a cross-sectional view taken along line I-I' and line II-II' in FIG. 2 according to an exemplary embodiment of the present invention.

FIG. 9 is a cross-sectional view taken along line I-I' and line II-II' in FIG. 2 according to an exemplary embodiment of the present invention.

Referring to FIG. 9, the stress neutralizing layer 700 may be disposed on the planarization layer 140 in the first area 1A, the bending area BA, and the second area 2A. For example, the stress neutralizing layer 700 may be disposed on the planarization layer 140 in the non-display area NDA, the bending area BA, and the second area 2A. In an exemplary embodiment of the present invention, the stress neutralizing layer 700 may overlap the first conductive layer 213a, the second conductive layer 213b, and the connection line 215 (e.g., along the Z-axis direction when the display device is in a substantially flat state).

The stress neutralizing layer 700 in the first area 1A, the bending area BA, and the second area 2A may have substantially the same thickness T in the entire portion of all of the areas. For example, the thickness T of the stress neutralizing layer 700 in the first area 1A, the bending area BA, and the second area 2A may be, for example, in a range of from about 0.1 μm to about 50 μm.

A modulus of the stress neutralizing layer 700 in the first area 1A, the bending area BA, and the second area 2A may be, for example, in a range of from about 350 MPa to about 500 MPa.

The stress neutralizing layer 700 in the first area 1A, the bending area BA and the second area 2A may have a thickness less than a thickness of the polarizing member 500 (T<T3). As an example, the thickness T (e.g., a maximum thickness) of the stress neutralizing layer 700 in the first area 1A, the bending area BA and the second area 2A may be less than a total thickness T3 of the thickness of the first adhesive layer 510, the thickness of the polarizing plate 520, and the thickness of the second adhesive layer 530.

Figure 10A:
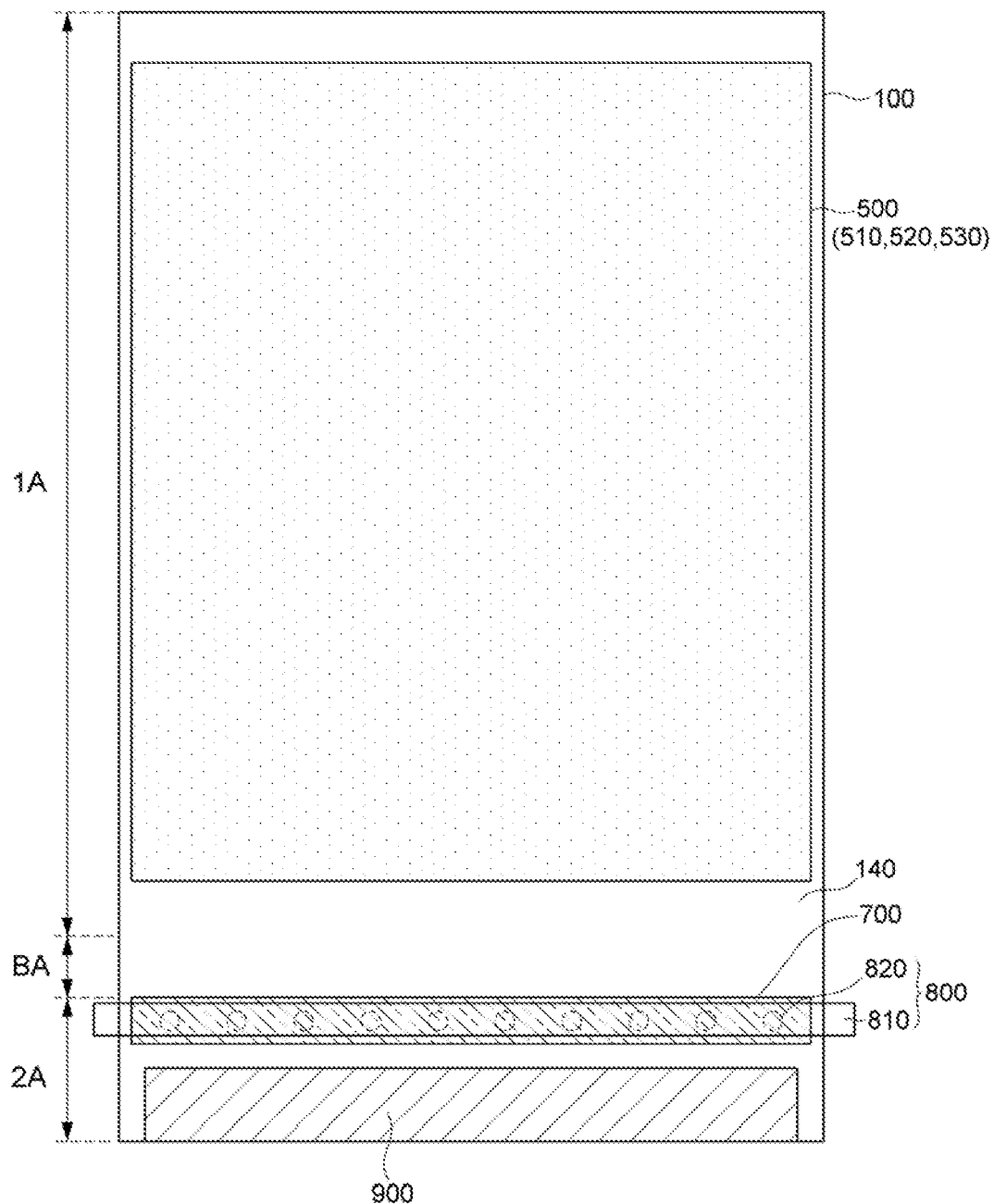
FIGS. 10A, 10B and 10C are plan views of a method of manufacturing a display device according to an exemplary embodiment of the present invention.
Figure 10B:
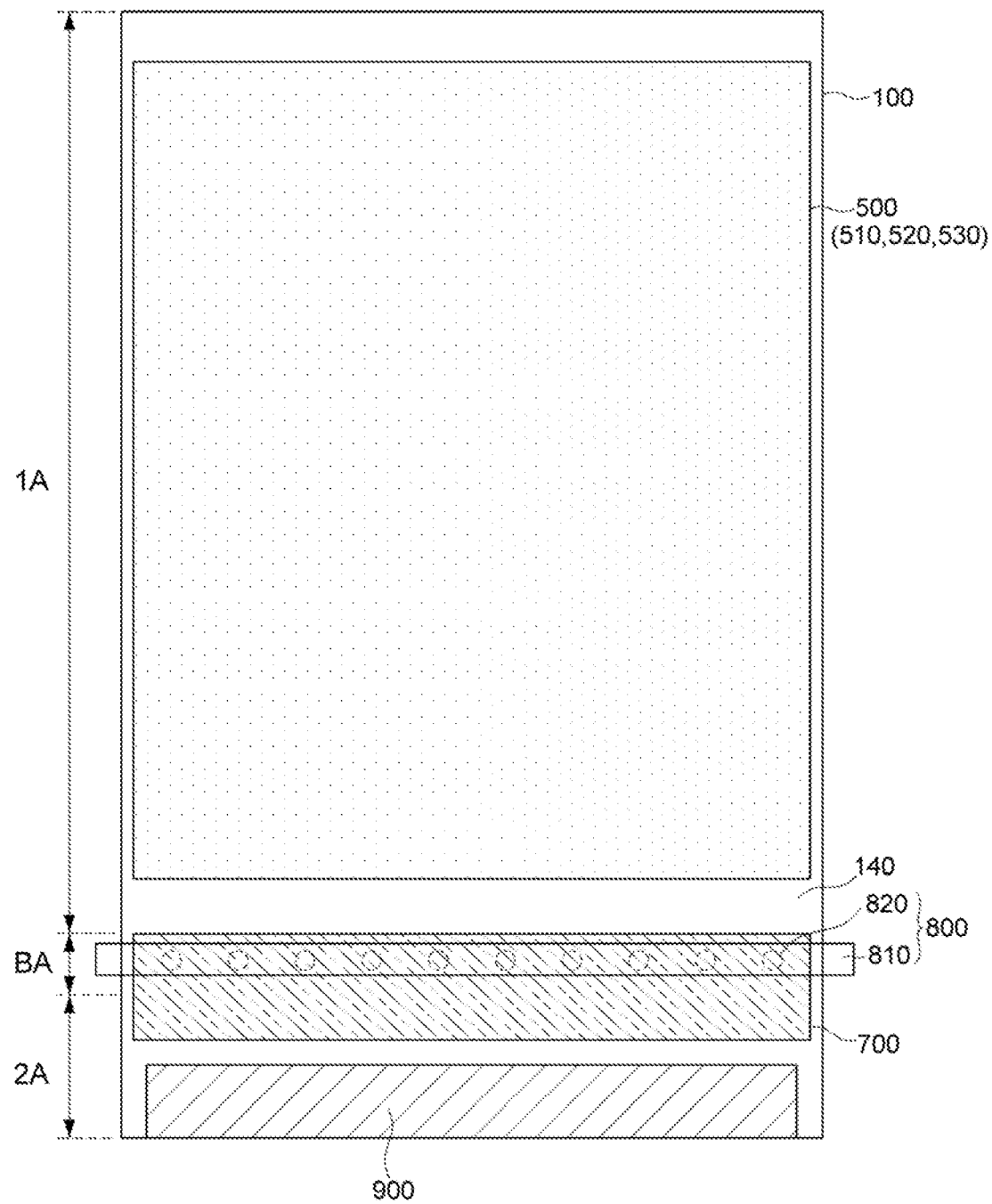
Figure 10C:
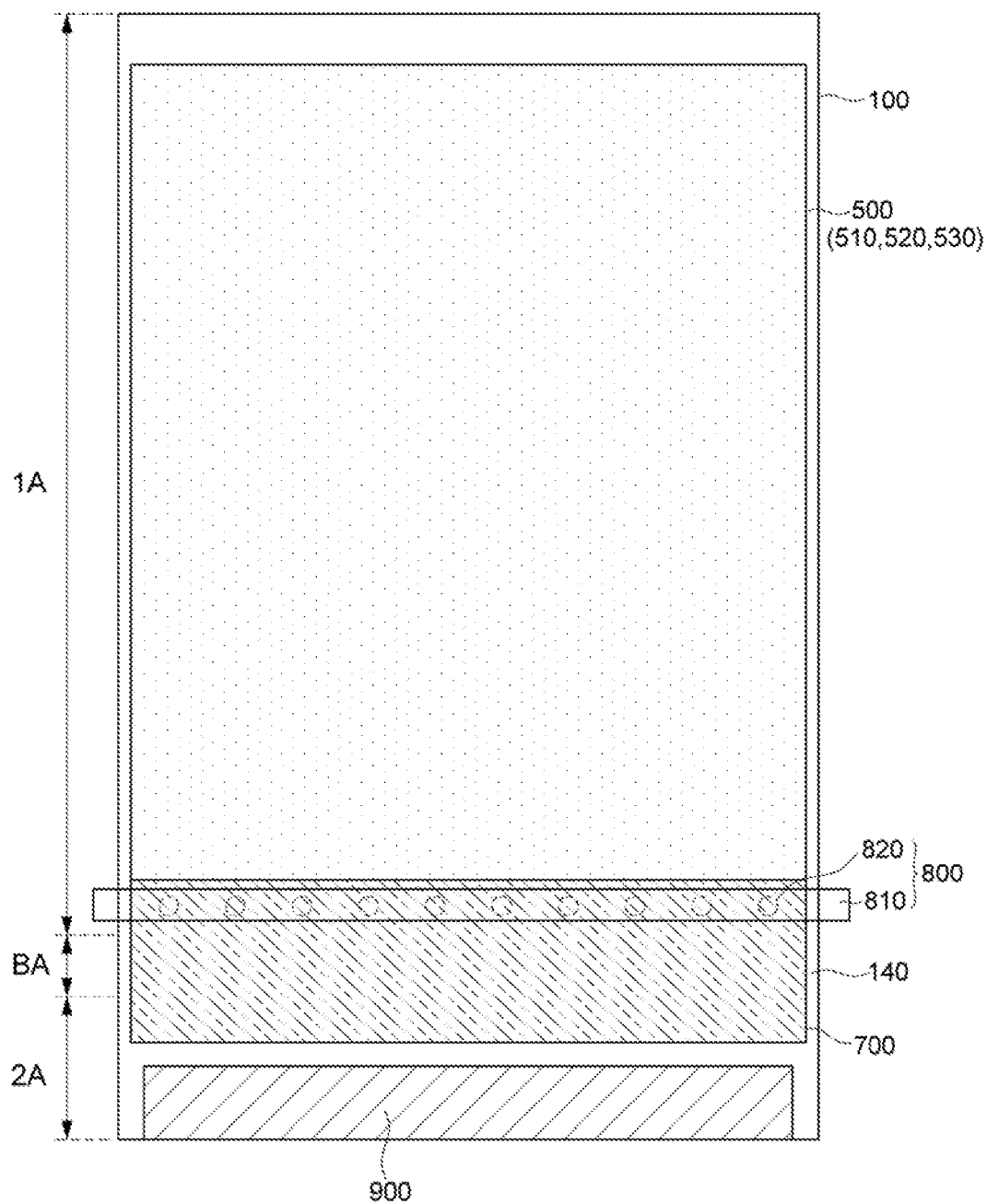
Figure 11:
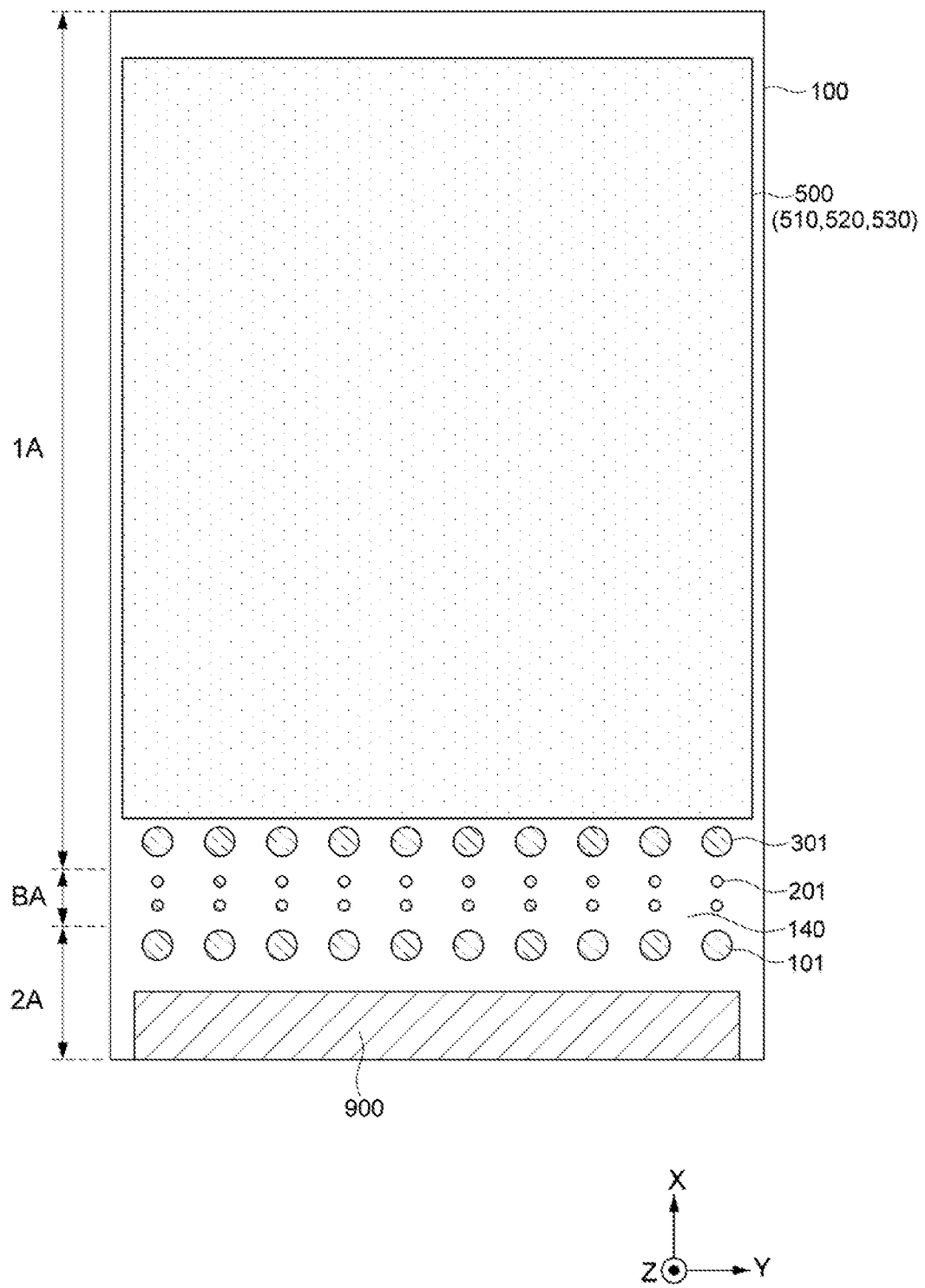
FIG. 11 is a plan view of materials applied to a first area, a bending area, and a second area according to an exemplary embodiment of the present invention.

FIGS. 10A, 10B and 10C are views of a method of manufacturing a display device according to an exemplary embodiment of the present invention. FIG. 11 is a plan view of materials applied to a first area, a bending area, and a second area according to an exemplary embodiment of the present invention.

Referring to FIG. 10A, an inkjet apparatus 800 may include a head 810 and a plurality of nozzles 820 disposed along the head 810. The plurality of nozzles 820 may be spaced apart from each other on the head 810 at a predetermined interval. Alternatively, spacing between adjacent nozzles 820 may vary across the head 810. These nozzles 820 may be located between the head 810 and the substrate 100.

The inkjet apparatus 800 may discharge a material for forming the stress neutralizing layer 700 through the nozzles 820. In an exemplary embodiment of the present invention, the discharge amount of the material from the inkjet apparatus 800 may be controlled according to a control signal from the outside. For example, the control signal may include a first control signal and a second control signal, and the nozzle 820 to which the first control signal is applied may discharge the material in an amount larger than an amount of the material discharged from the nozzle 820 to which the second control signal is applied.

The material may have a viscosity of about 50 cP at room temperature. The material may have a modulus of about 400 MPa. The material may include an acrylic resin or a urethane-based resin.

Referring to FIGS. 10A to 10C, the inkjet apparatus 800 may move along the X-axis arrow direction on the substrate 100 in the state that the substrate 100 is fastened (e.g., a substantially flat state). For example, the inkjet apparatus 800 may move from the second area 2A toward the first area 1A. Accordingly, the inkjet apparatus 800 may sequentially pass through the second area 2A, the bending area BA, and the first area 1A. Alternatively, the substrate 100 may move along the opposite direction of the X-axis arrow direction while the inkjet apparatus 800 is fastened.

Referring to FIG. 10A, the substrate 100 to which the polarizing member 500 and the controller 900 are attached may be prepared. Components described with reference to FIG. 3, for example, other than the window 600 and the stress neutralizing layer 700 may be further formed on the substrate 100 described with reference to FIG. 10A.

The inkjet apparatus 800 may be disposed above the substrate 100 in the second area 2A. A first control signal may be applied to the nozzles 820 of the inkjet apparatus 800. Then, each nozzle 820 may discharge the material according to the first control signal. The material discharged from the nozzles 820 may be applied onto the planarization layer 140 in the second area 2A.

Referring to FIG. 10B, the inkjet apparatus 800 may be disposed above the substrate in the bending area BA. A second control signal may be applied to the nozzles 820 of the inkjet apparatus 800. Then, each nozzle 820 may discharge the material according to the second control signal. The material discharged from the nozzles 820 may be applied onto the planarization layer 140 in the bending area BA.

Referring to FIG. 10C, the inkjet apparatus 800 may be disposed above the substrate 100 in the first area 1A. The first control signal may be applied to the nozzles 820 of the inkjet apparatus 800. Then, each nozzle 820 may discharge the material according to the first control signal. The material discharged from the nozzles 820 may be applied onto the planarization layer 140 in the first area 1A.

Referring to FIG. 11, a material 201 of the bending area BA may have an area less than an area of each of materials 101 and 301 of the first and second areas 1A and 2A. In addition, the material 201 of the bending area BA may have a thickness less than a thickness of each of the materials 101 and 301 of the first and second areas 1A and 2A. The amount of the material 201 applied in the bending area BA may be less than the amount of each of the materials 101 and 301 applied in the first and second areas 1A and 2A.

Then, the materials 101, 201, and 301 of the first area 1A, the bending area BA, and the second area 2A may be cured, and the stress neutralizing layer 700 described herein may be formed. For example, referring to FIG. 3, the stress neutralizing layer 700 having a thickness T in the bending area BA may be formed.

Figure 12A:
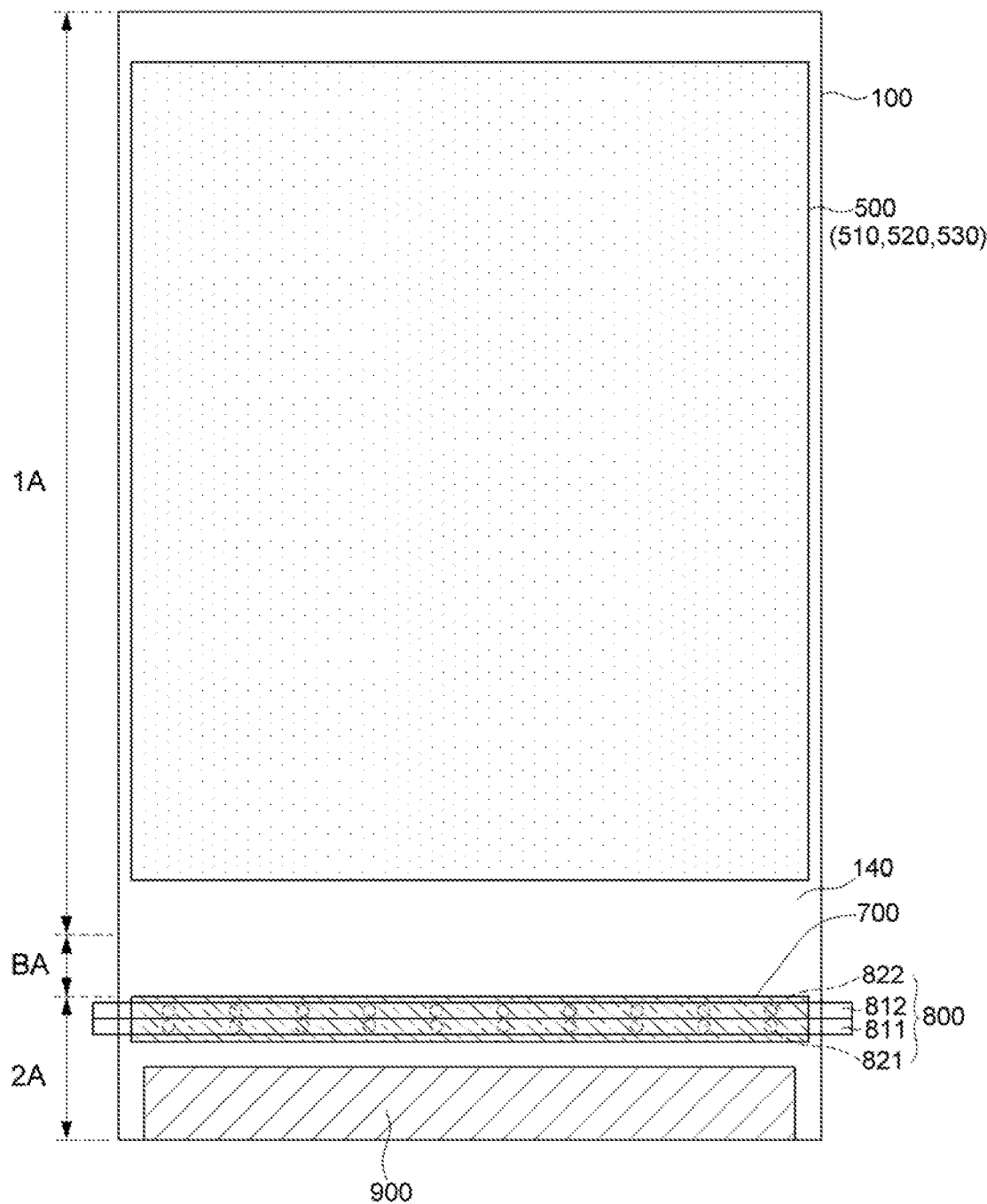
FIGS. 12A, 12B and 12C are plan views of a method of manufacturing a display device according to an exemplary embodiment of the present invention.
Figure 12B:
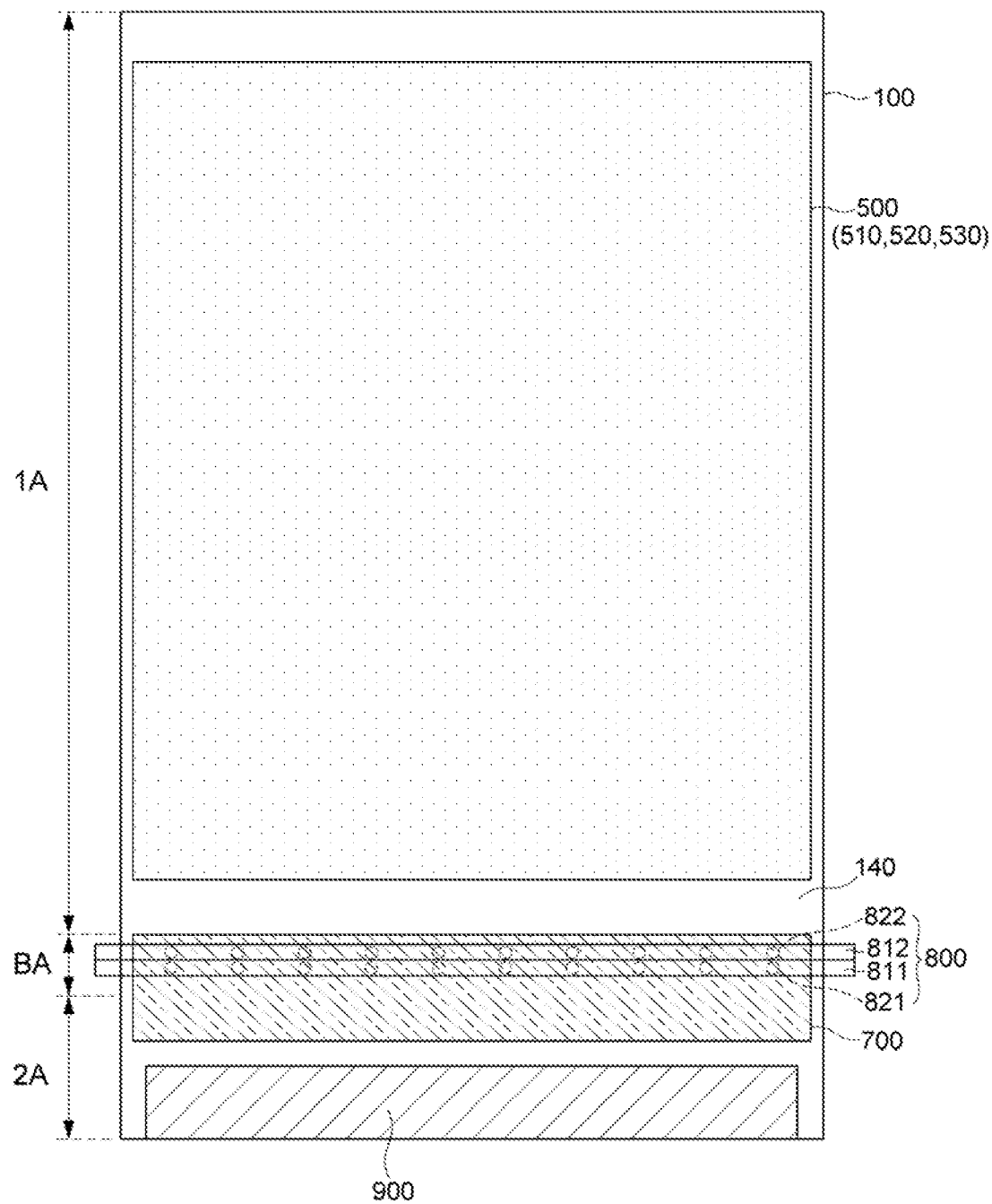
Figure 12C:
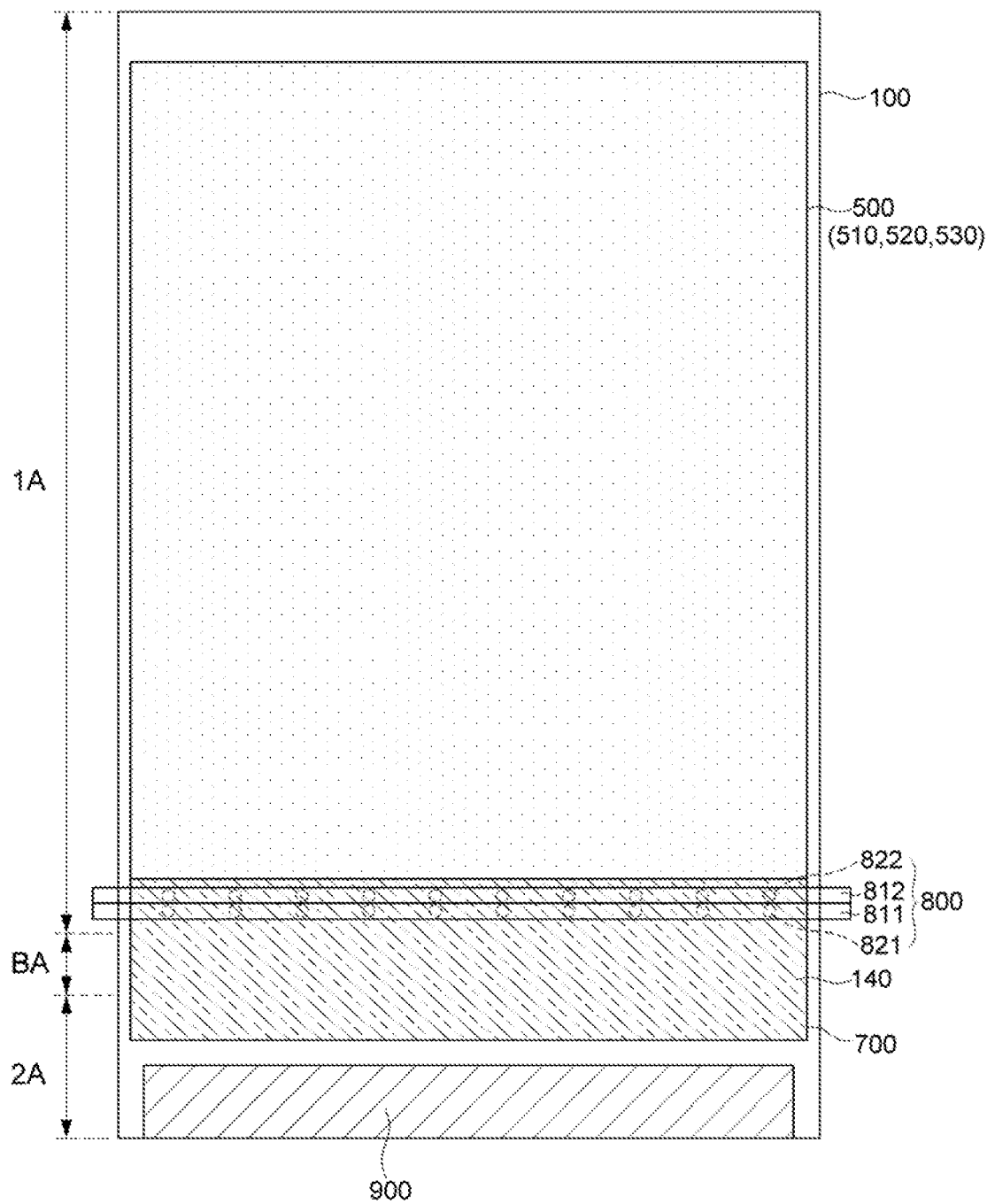

FIGS. 12A, 12B and 12C are plan views of a method of manufacturing a display device according to an exemplary embodiment of the present invention on.

Referring to FIG. 12A, the inkjet apparatus 800 may include a first head 811, a plurality of first nozzles 821 disposed along the first head 811, a second head 812, and a plurality of second nozzles 822 disposed along the second head 812.

The plurality of first nozzles 821 may be spaced apart from each other along the first head 811 at a predetermined interval. Alternatively, spacing between adjacent first nozzles 821 may vary across the first head 811.

The plurality of second nozzles 822 may be disposed at the second head 812 at a predetermined interval. The interval between the second nozzles 822 and the interval between the first nozzles 821 may be substantially equal to each other.

The inkjet apparatus 800 may discharge the material to form the stress neutralizing layer 700 through the first and second nozzles 821 and 822. In an exemplary embodiment of the present invention, whether or not the inkjet apparatus 800 discharges the material may be controlled according to a control signal from the outside. For example, the control signal may include a first control signal and a second control signal, and the nozzle 820 to which the first control signal is applied may discharge the material, and the nozzle 820 to which the second control signal is applied need not discharge the material Referring to FIGS. 12A to 12C, the inkjet apparatus 800 may move along the X-axis arrow direction on the substrate 100 in the state that the substrate 100 is fastened (e.g., in a substantially flat state). For example, the inkjet apparatus 800 may move from the second area 2A toward the first area 1A. Accordingly, the inkjet apparatus 800 may sequentially pass through the second area 2A, the bending area BA, and the first area 1A. Alternatively, the substrate 100 may move along the opposite direction of the X-axis arrow direction while the inkjet apparatus 800 is fastened.

Referring to FIG. 12A, the substrate 100 to which the polarizing member 500 and the controller 900 are attached may be prepared. Components described with reference to FIG. 3 other than the window 600 and the stress neutralizing layer 700 may be further formed on the substrate 100 described with reference to FIG. 12A.

The inkjet apparatus 800 may be disposed above the substrate 100 in the second area 2A The first control signal may be applied to the first and second nozzles 821 and 822 of the inkjet apparatus 800. Then, each of the first and second nozzles 821 and 822 may discharge the material according to the first control signal. The material discharged from the first and second nozzles 821 and 822 may be applied onto the planarization layer 140 in the second area 2A.

Referring to FIG. 12B, the inkjet apparatus 800 may be disposed above the substrate 100 in the bending area BA. The first control signal may be applied to one type of nozzles of the first nozzles 821 and the second nozzles 822 of the inkjet apparatus 800, and the second control signal may be applied to the other type of the nozzles. For example, the first control signal may be applied to all the first nozzles 821 of the first head 811, while the second control signal may be applied to all the second nozzles 822 of the second head 812. Then, the material may be discharged only from the first nozzles 821, and the material might not be discharged from the second nozzles 822. For example, the material may be discharged only from the first nozzles 821 that has received the first control signal among the first and second nozzles 821 and 822 in a selective manner. The material discharged from the first nozzles 821 may be applied onto the planarization layer 140 in the bending area BA.

Referring to FIG. 12C, the inkjet apparatus 800 may be disposed above the substrate 100 in the first area 1A. The first control signal may be applied to all the first and second nozzles 821 and 822 of the inkjet apparatus 800. Then, each of the first and second nozzles 822 may discharge the material according to the first control signal. The material discharged from the first and second nozzles 821 and 822 may be applied onto the planarization layer 140 in the first area 1A.

According to the process described with reference to FIGS. 12A to 12C, the material in the bending area BA may have an area less than an area of the material in each of the first and second areas 1A and 2A. In addition, the material in the bending area BA may have a thickness less than a thickness of the material in each of the first and second areas 1A and 2A. This is because the amount of the material applied in the bending area BA may be less than the amount of the material applied in each of the first and second areas 1A and 2A.

The materials in the first area 1A, the bending area BA and the second area 2A may be cured, and thus the stress neutralizing layer 700 described herein may be formed. For example, referring to FIG. 3, the stress neutralizing layer 700 that has the thickness T in the bending area BA may be formed.

Figure 13A:
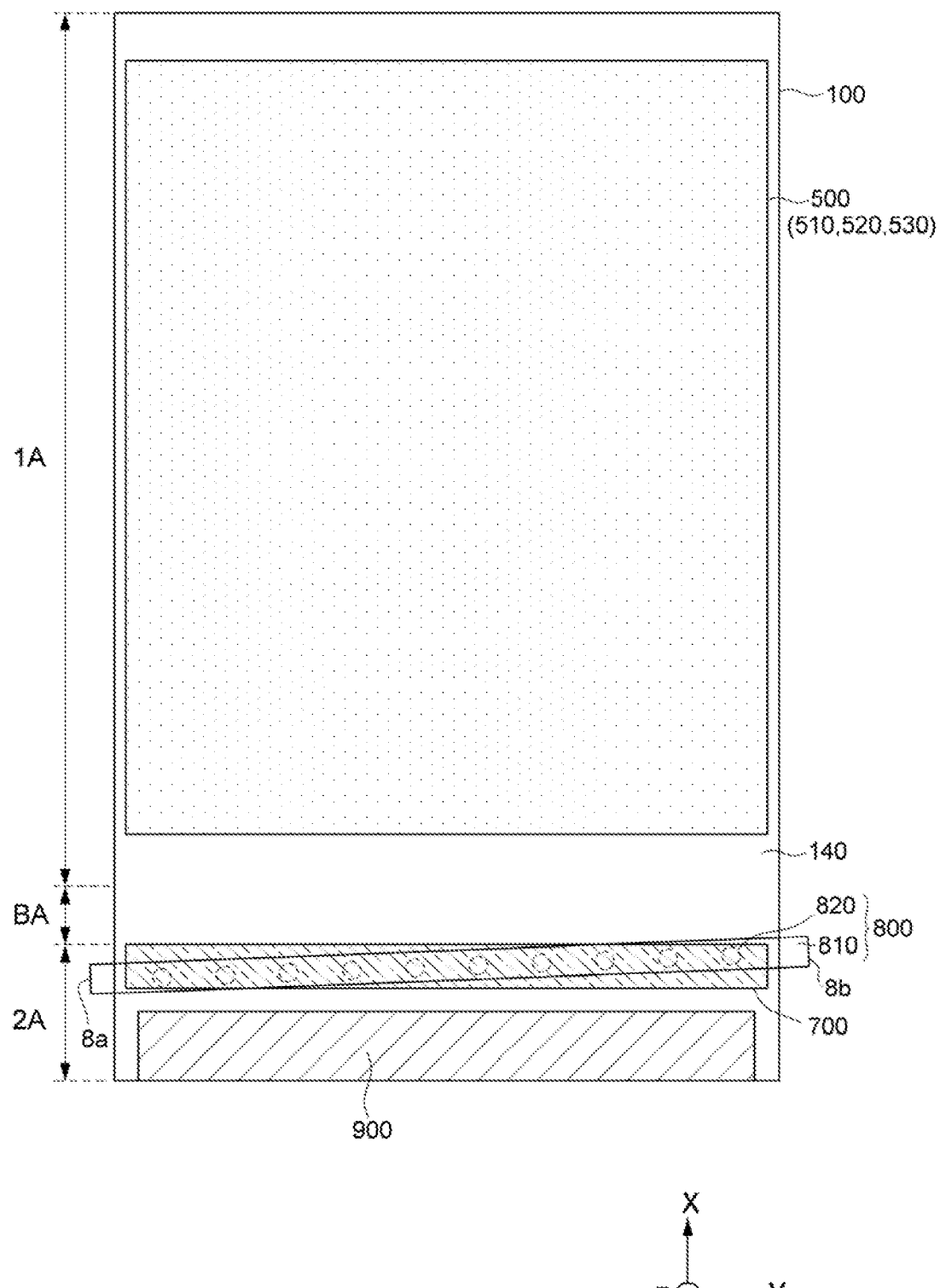
FIGS. 13A, 13B and 13C are plan views of a method of manufacturing a display device according to an exemplary embodiment of the present invention.
Figure 13B:
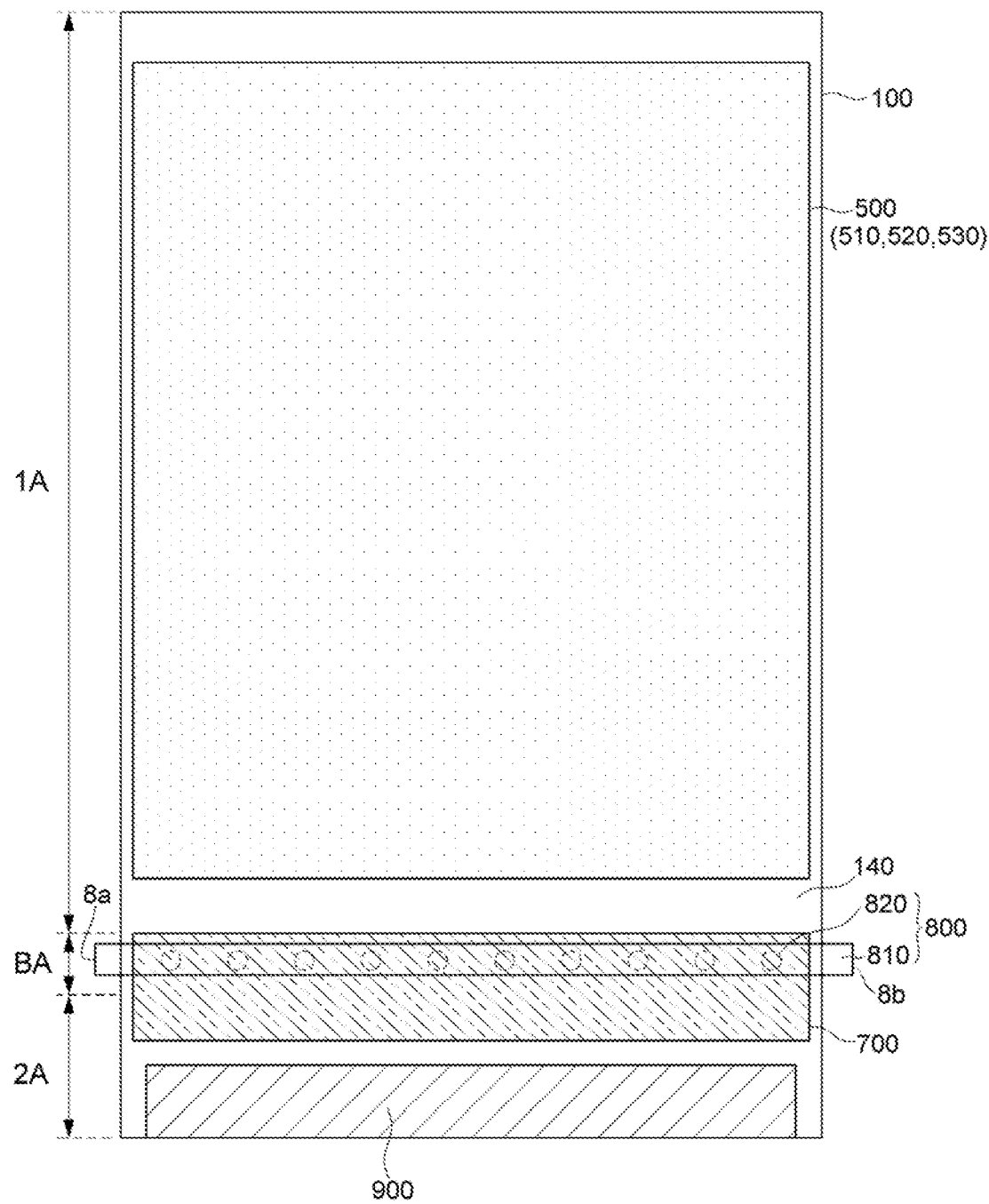
Figure 13B:
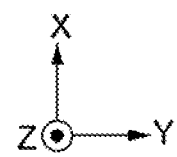
Figure 13C:
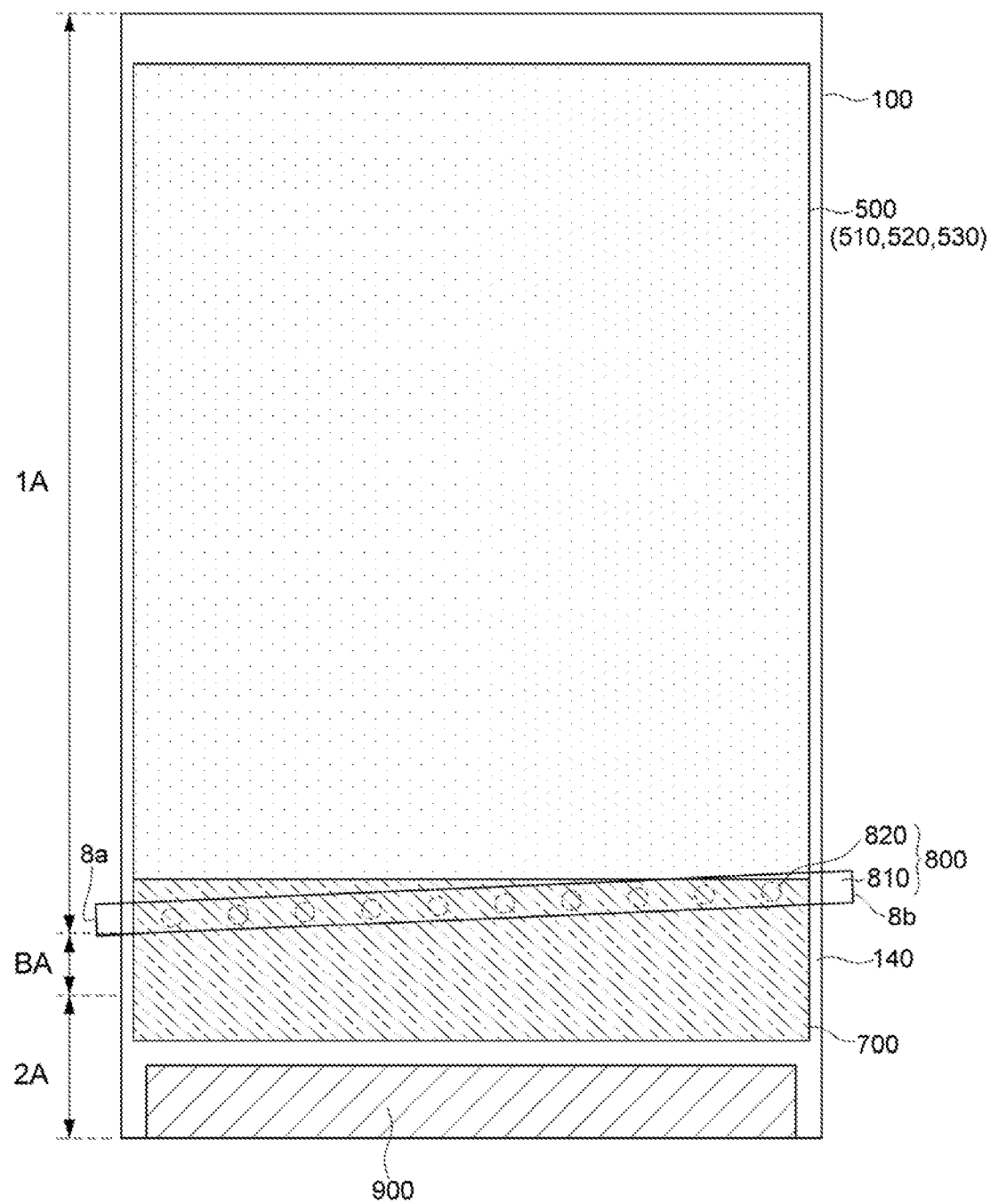

FIGS. 13A, 13B and 13C are plan views of a method of manufacturing a display device according to an exemplary embodiment of the present invention.

Referring to FIG. 13A to 13C, the inkjet apparatus 800 may include the head 810 and a plurality of nozzles 820 disposed along the head 810. The plurality of nozzles 820 may be spaced apart from each other along the head 810 at a predetermined interval. Alternatively, spacing between adjacent nozzles 820 may vary across the head 810.

The inkjet apparatus 800 may discharge a material for forming the stress neutralizing layer 700 through the nozzles 820.

The inkjet apparatus 800 may move along the X-axis arrow direction on the substrate 100 in the state that the substrate 100 is fastened (e.g., in a substantially flat state). For example, the inkjet apparatus 800 may move from the second area 2A toward the first area 1A. Accordingly, the inkjet apparatus 800 may sequentially pass through the second area 2A, the bending area BA, and the first area 1A. Alternatively, the substrate 100 may move along the opposite direction of the X-axis arrow direction while the inkjet apparatus 800 is fastened.

Referring to FIG. 13A, the substrate 100 to which the polarizing member 500 and the controller 900 are attached may be prepared. Components described with reference to FIG. 3 other than the window and the stress neutralizing layer 700 may be further formed on the substrate 100 described with reference to FIG. 13A.

The inkjet apparatus 800 may be disposed above the substrate 100 in the second area 2A. In an exemplary embodiment of the present invention, the head 810 may rotate clockwise or counterclockwise with respect to a first end portion 8a of the head 810. For example, when two end portions of the head 810 that face each other along the arrangement direction of the nozzles 820 are defined as a first end portion 8a and a second end portion 8b, respectively, the head 810 may rotate counterclockwise about its first end portion 8a in the state that the first end portion 8a is fastened. In an exemplary embodiment of the present invention, the second end portion 8b may be positioned ahead of the first end portion 8a with respect to the advancing direction of the inkjet apparatus 800 (e.g., the X-axis arrow direction).

Accordingly, the plurality of nozzles 820 may be arranged diagonally with respect to the advancing direction of the inkjet apparatus 800. Accordingly, a nozzle 820 (which may be referred to herein as "a first outermost nozzle") that is closest to the first end portion 8a of the plurality of nozzles 820 may be located at the backmost position in the advancing direction, and a nozzle 820 (which may be referred to herein as "a second outermost nozzle") that is closest to the second end portion 8b of the plurality of nozzles 820 is located at the foremost position in the advancing direction. As an example, the nozzle 820 may be positioned more to the front in the advancing direction, as it is closer to the second end portion 8b.

In the case where the nozzles 820 are arranged diagonally with respect to the advancing direction of the inkjet apparatus 800, the plurality of nozzles 820 may discharge the material at different points in time. For example, the second outermost nozzle located at the foremost position in the advancing direction of the inkjet apparatus 800 may discharge the material first, and the first outermost nozzle located at the backmost position in the advancing direction may discharge the material the latest. As an example, as the nozzle 820 may be closer to the second end portion 8b, the material may be discharged at an earlier point in time. This is because as the nozzle 820 may be positioned further to the front in the advancing direction, and thus may enter the corresponding area earlier. The material discharge time of each nozzle 820 may be substantially the same as each other. For example, although the material discharge points in time of the respective nozzles 820 may be different from each other, the respective lengths of time from the material discharge start point in time to the material discharge end point in time may be substantially the same. Each nozzle 820 may discharge the material during the period from the material discharge start point in time to the material discharge end point in time. The material sequentially discharged from the nozzles 820 may be applied onto the planarization layer 140 in the second area 2A.

Referring to FIG. 13B, the inkjet apparatus 800 may be disposed above the substrate 100 in the bending area BA. The head 810 may rotate clockwise with respect to the first end portion 8a of the head 810. The first end portion 8a and the second end portion 8b may be located on substantially the same horizontal line with respect to the advancing direction of the inkjet apparatus 800.

Accordingly, the plurality of nozzles 820 may be arranged in a direction perpendicular to the advancing direction of the inkjet apparatus 800.

When the nozzles 820 are arranged in the direction perpendicular to the advancing direction of the inkjet apparatus 800, the plurality of nozzles 820 may discharge the material at substantially the same time. In addition, the material discharge time of each nozzle 820 may be substantially the same. The material substantially simultaneously discharged from the nozzles 820 may be applied onto the planarization layer 140 in the bending area BA.

Referring to FIG. 13C, the inkjet apparatus 800 may be disposed above the substrate 100 in the first area 1A. The head 810 may rotate clockwise or counterclockwise with respect to the first end portion 8a of the head 810. For example, the head 810 may rotate counterclockwise about the first end portion 8a in the state that the first end portion 8a is fastened (e.g., in a substantially flat state). The second end portion 8b may be positioned ahead of the first end portion 8a with respect to the advancing direction of the inkjet apparatus 800.

Accordingly, the plurality of nozzles 820 may be arranged diagonally with respect to the advancing direction of the inkjet apparatus 800.

In the case where the nozzles 820 are arranged diagonally with respect to the advancing direction of the inkjet apparatus 800, the plurality of nozzles 820 may discharge the material at different points in time. For example, the second outermost nozzle located at the foremost position in the advancing direction of the inkjet apparatus 800 may discharge the material first, and the first outermost nozzle located at the backmost position in the advancing direction may discharge the material the latest. As an example, as the nozzle 820 is closer to the second end portion 8b, the material may be discharged at an earlier point in time. This is because as the nozzle 820 may be positioned further to the front in the advancing direction, it may the corresponding area earlier. The material discharge time of each nozzles 820 may be substantially the same as each other. For example, although the material discharge points in time of the respective nozzles 820 may be different from each other, the respective lengths of time from the material discharge start point in time to the material discharge end point in time may be substantially the same. Each nozzle 820 may discharge the material during the period from the material discharge start point in time to the material discharge end point in time. The material sequentially discharged from the nozzles 820 may be applied onto the planarization layer 140 in the first area 1A.

When the nozzles 820 are arranged diagonally with respect to the advancing direction of the inkjet apparatus 800, the interval between adjacent nozzles 820 may be defined as a first interval. In addition, when the nozzles 820 are arranged in the direction perpendicular to the advancing direction of the inkjet apparatus 800, the interval between adjacent nozzles 820 may be s defined as a second interval.

The first interval may be less than the second interval. Accordingly, the materials discharged from the adjacent nozzles 820 described with reference to FIGS. 13A and 13C may be located relatively closer to each other, while the materials discharged from the adjacent nozzles 820 in FIG. 13B may be located relatively farther away from each other. Accordingly, the amount of the material per unit area in FIGS. 13A and 13C may be larger than the amount of the material per unit area in FIG. 13B. Accordingly, the material in the bending area BA may have an area less than an area of the material in each of the first and second areas 1A and 2A. In addition, the material in the bending area BA may have a thickness less than a thickness of the material in each of the first and second areas 1A and 2A. This is because the amount of the material applied in the bending area BA may be less than the amount of the material applied in each of the first and second areas 1A and 2A.

The materials in the first area 1A, the bending area BA and the second area 2A may be cured, and thus the stress-neutralizing layer 700 described herein may be formed. For example, as described with reference to FIG. 3, the stress neutralizing layer 700 that has the thickness T in the bending area BA may be formed.

Figure 14A:
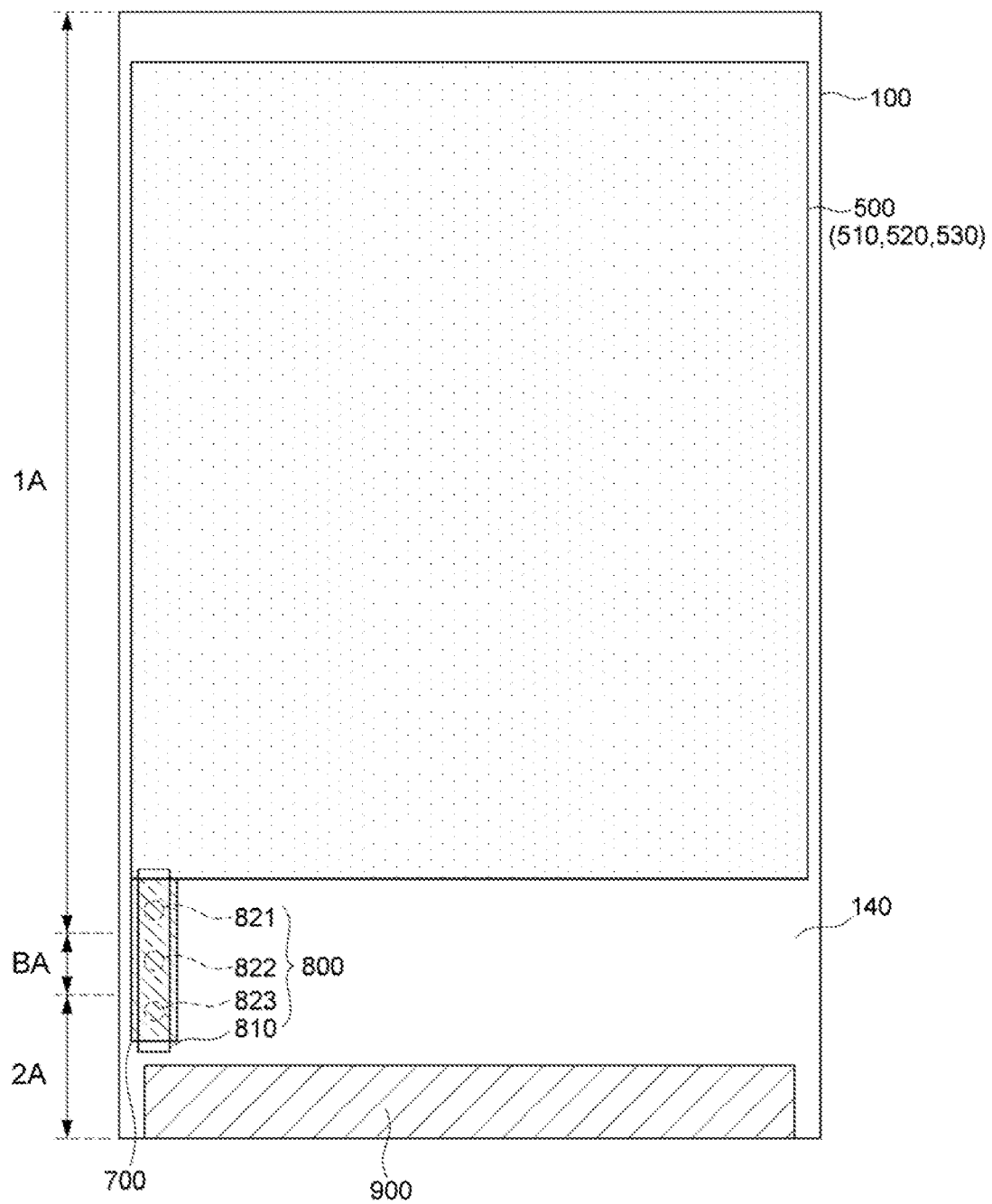
FIGS. 14A, 14B and 14C are plan views of a method of manufacturing a display device according to an exemplary embodiment of the present invention.
Figure 14B:
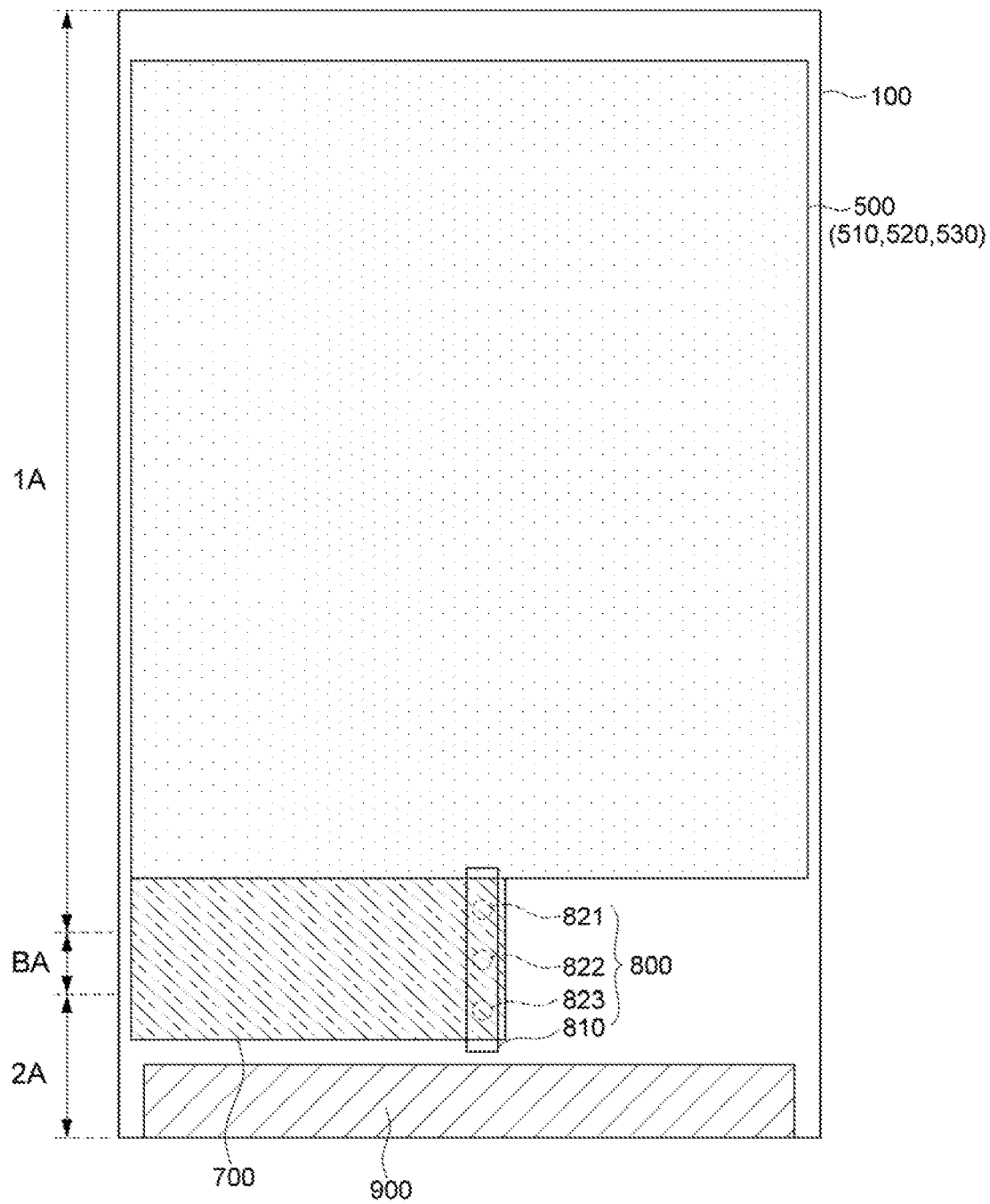
Figure 14C:
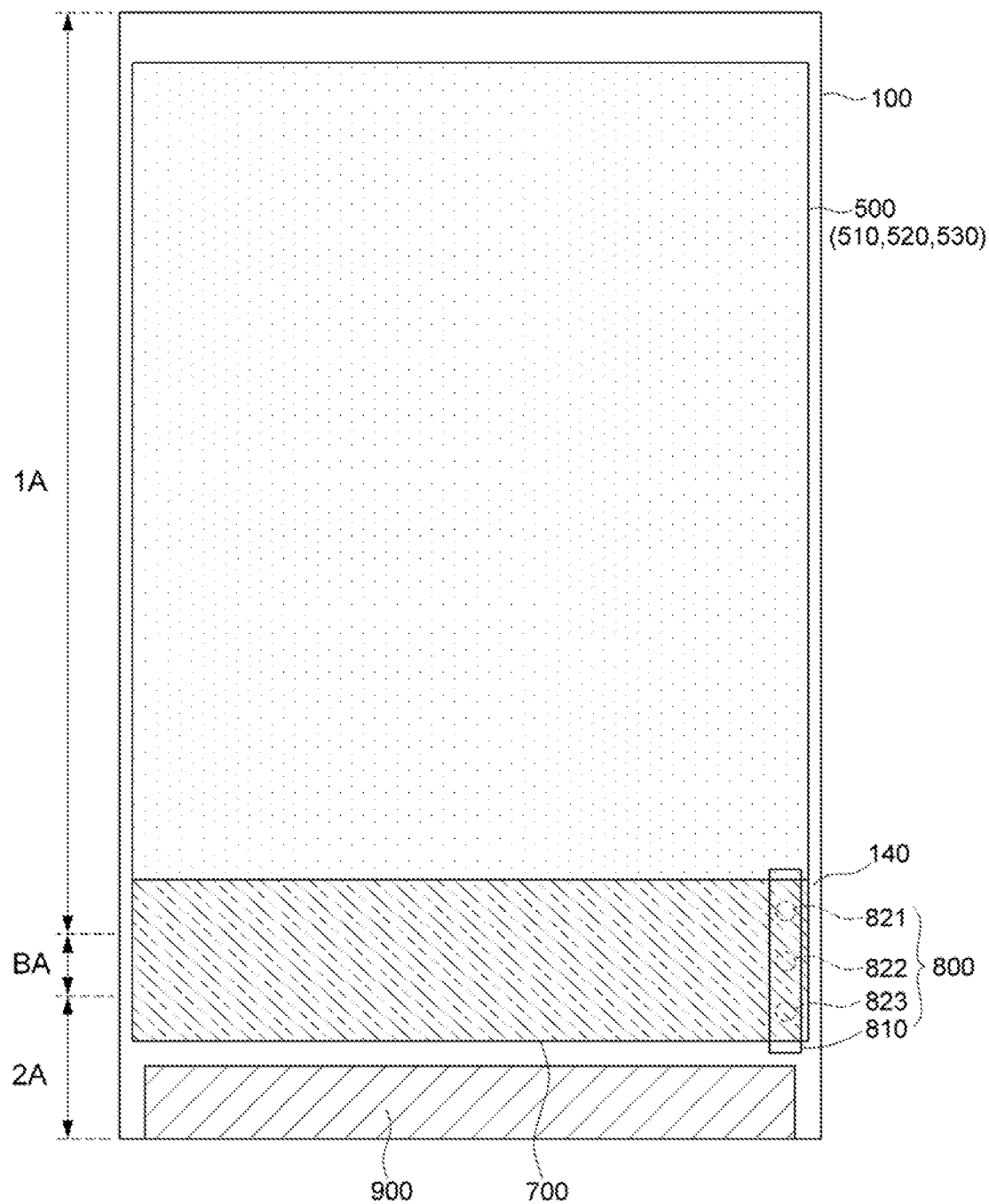

FIGS. 14A, 14B and 14C are plan views of a method of manufacturing a display device according to an exemplary embodiment of the present invention.

Referring to FIG. 14A, the inkjet apparatus 800 may include the head 810 and a plurality of nozzles 820 disposed along the head 810. The plurality of nozzles 820 may be spaced apart from each other on the head 810 at a predetermined interval. Alternatively, spacing between the nozzles 820 may vary along the head 810.

The inkjet apparatus 800 may discharge a material for forming the stress neutralizing layer 700 through the nozzles 820. In an exemplary embodiment of the present invention, the discharge amount of the material from the inkjet apparatus 800 may be controlled according to a control signal from the outside. For example, the control signal may include a first control signal and a second control signal, and the nozzle 820 to which the first control signal is applied may discharge the material in an amount larger than an amount of the material discharged from the nozzle 820 to which the second control signal is applied.

Referring to FIGS. 14A to 14C, the inkjet apparatus 800 may move along the Y-axis arrow direction on the substrate 100 in the state that the substrate 100 is fastened (e.g., in a substantially flat state). Alternatively, the substrate 100 may move along the opposite direction of the Y-axis arrow direction while the inkjet apparatus 800 is fastened.

Some of the plurality of nozzles 820 may be located in the second area 2A, some other nozzles 820 may be located in the bending area BA, and the remaining nozzles 820 may be located in the first area 1A. For example, the first nozzle 821 may be located in the first area 1A, the second nozzle 822 may be located in the bending area BA, and the third nozzle 823 may be located in the second area 2A.

The first nozzle 821 and the third nozzle 823 may receive the first control signal, and the second nozzle 822 may receive the second control signal. Accordingly, the amount of the material discharged from the second nozzle 822 may be less than the amount of the material discharged from each of the first and third nozzles 821 and 823.

The substrate 100 to which the polarizing member 500 and the controller 900 are attached may be prepared. Components described with reference to FIG. 3 other than the window 600 and the stress neutralizing layer 700 may be further formed on the substrate 100 described with reference to FIG. 14A.

The inkjet apparatus 800 may be disposed at a side edge of the substrate 100.

As the inkjet apparatus 800 moves toward the right side (see, e.g., FIGS. 14B and 14C), the material discharged from the first nozzle 821 may be applied onto the planarization layer 140 in the first area 1A, the material discharged from the second nozzle 822 may be applied onto the planarization layer 140 in the bending area BA, and the material discharged from the third nozzle 823 may be applied onto the planarization layer 140 in the second area 2A.

The material in the bending area BA may have an area less than an area of the material in each of the first and second areas 1A and 2A. In addition, the material in the bending area BA may have a thickness less than a thickness of the material in each of the first and second areas 1A and 2A. This is because the amount of the material applied in the bending area BA may be less than the amount of the material applied in each of the first and second areas 1A and 2A.

The materials of the first area 1A, the bending area BA, and the second area 2A may be cured, and the stress neutralizing layer 700 described herein may be formed. For example, referring to FIG. 3, the stress neutralizing layer 700 having the thickness T in the bending area BA may be formed.

The display device according to an exemplary embodiment of the present invention may include a stress neutralizing layer disposed at a bending area of the substrate and areas of the substrate adjacent to the bending area. In such a case, the stress neutralizing layer in the bending area may have a thickness less than a thickness of the stress neutralizing layer in the adjacent areas. Accordingly, the tensile stress in the bending area may be reduced. Accordingly, cracking of the insulating layer or the signal line in the bending area may be reduced or eliminated.

In addition, the tensile stress of the stress neutralizing layer in the bending area may be reduced, and thus the bending area may have a smaller radius of curvature. Accordingly, the size of the display device may be reduced. For example, the display device according to an exemplary embodiment of the present invention may be relatively slim or thin.

While the present invention has been illustrated and described with reference to the embodiments thereof, it will be apparent to those of ordinary skill in the art that various changes in form and detail may be formed thereto without departing from the spirit and scope of the present invention.

What is claimed is:
1. A display device comprising:
a substrate having a first area, a second area, and a bending area between the first area and the second area;
a display element disposed in the first area of the substrate; and a stress neutralizing layer disposed in the first area, the second area and the bending area, wherein a thickness of the stress neutralizing layer in the entire bending area is less than about ½ of a thickness of the stress neutralizing layer in at least one of the first area or the second area.

2. The display device of claim 1, wherein the stress neutralizing layer has a thickness in a range of from about 0.1 μm to about 50 μm.

3. The display device of claim 1, wherein the stress neutralizing layer has a modulus in a range of from about 350 MPa to about 500 MPa.

4. The display device of claim 1, further comprising a polarizing member disposed on the display element in the first area of the substrate.

5. The display device of claim 4, wherein the thickness of the stress neutralizing layer in substantially the entire bending area is less than a thickness of the polarizing member.

6. The display device of claim 4, wherein the polarizing member comprises:
a first adhesive layer on the display element;
a second adhesive layer on the first adhesive layer; and
a polarizing plate between the first adhesive layer and the second adhesive layer.

7. The display device of claim 1, wherein a first surface of the stress neutralizing layer in the first area and a second surface of the stress neutralizing layer in the second area that faces the first surface each have a straight line shape.

8. The display device of claim 1, wherein a first surface of the stress neutralizing layer in the first area and a second surface of the stress neutralizing layer in the second area that faces the first surface each have a curved line shape.

9. The display device of claim 1, wherein the stress neutralizing layer in the bending area comprises a concavo-convex pattern.

10. The display device of claim 1, wherein the stress neutralizing layer in the bending area comprises a plurality of neutralizing layers separated from each other.

11. The display device of claim 10, wherein the neutralizing layers have a substantially same thickness as each other.

12. The display device of claim 10, wherein the neutralizing layers have different thicknesses from each other.

13. The display device of claim 1, wherein the stress neutralizing layer comprises an acrylic resin or a urethane-based resin.

14. The display device of claim 1, further comprising a controller disposed in the second area.

15. The display device of claim 1, wherein the thickness of the stress neutralizing layer in substantially the entire bending area is less than the thickness of stress neutralizing layer in at least one of the first area or the second area.

16. The display device of claim 15, wherein the thickness of the stress neutralizing layer in the bending area is substantially constant across the entire bending area.

17. A display device comprising:
a substrate having a first area, a second area, and a bending area between the first area and the second area;
a display element disposed in the first area of the substrate;
a stress neutralizing layer disposed in the first area, the second area and the bending area; and
a polarizing member disposed on the display element in the first area of the substrate,
wherein a thickness of the stress neutralizing layer in the first area and the second area is greater than a thickness of the polarizing member.

18. A display device comprising:
a substrate having a first area, a second area, and a bending area between the first area and the second area;
a display element disposed in the first area of the substrate; and
a stress neutralizing layer disposed in the first area, the second area and the bending area,
wherein a cross-section of the stress neutralizing layer in the bending area has a parabolic shape.

\* \* \* \* \*